United States Patent
Huang

(10) Patent No.: US 11,424,198 B2
(45) Date of Patent: Aug. 23, 2022

(54) SEMICONDUCTOR DEVICE WITH GRAPHENE LAYERS AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 17/008,983

(22) Filed: Sep. 1, 2020

(65) Prior Publication Data
US 2022/0068848 A1 Mar. 3, 2022

(51) Int. Cl.
*H01L 23/00* (2006.01)

(52) U.S. Cl.
CPC .............. *H01L 24/02* (2013.01); *H01L 24/05* (2013.01); *H01L 24/13* (2013.01); *H01L 2224/024* (2013.01); *H01L 2224/0239* (2013.01); *H01L 2224/02311* (2013.01); *H01L 2224/02331* (2013.01); *H01L 2224/0401* (2013.01); *H01L 2224/0508* (2013.01); *H01L 2224/05024* (2013.01); *H01L 2224/05124* (2013.01); *H01L 2224/05147* (2013.01); *H01L 2224/05155* (2013.01); *H01L 2224/05157* (2013.01); *H01L 2224/05164* (2013.01); *H01L 2224/05166* (2013.01); *H01L 2224/05171* (2013.01); *H01L 2224/05172* (2013.01); *H01L 2224/05184* (2013.01); *H01L 2224/05193* (2013.01); *H01L 2224/13026* (2013.01); *H01L 2924/0105* (2013.01); *H01L 2924/01013* (2013.01); *H01L 2924/01022* (2013.01); *H01L 2924/01027* (2013.01); *H01L 2924/01028* (2013.01); *H01L 2924/01029* (2013.01); *H01L 2924/01073* (2013.01); *H01L 2924/01074* (2013.01); *H01L 2924/01078* (2013.01); *H01L 2924/01079* (2013.01); *H01L 2924/04941* (2013.01); *H01L 2924/04953* (2013.01); *H01L 2924/0509* (2013.01); *H01L 2924/05042* (2013.01); *H01L 2924/05442* (2013.01); *H01L 2924/05994* (2013.01)

(58) Field of Classification Search
CPC ............................................ H01L 2224/05024
See application file for complete search history.

(56) References Cited

U.S. PATENT DOCUMENTS

| | | | | |
|---|---|---|---|---|
| 9,768,131 B2* | 9/2017 | Kraft | ........................ | H01L 24/06 |
| 2009/0020764 A1* | 1/2009 | Anderson | ............. | H01L 29/785 |
| | | | | 257/77 |
| 2013/0001519 A1* | 1/2013 | Chen | ................... | H01L 29/4908 |
| | | | | 257/29 |

* cited by examiner

*Primary Examiner* — Dale E Page
*Assistant Examiner* — Wilner Jean Baptiste
(74) *Attorney, Agent, or Firm* — Muncy, Geissler, Olds & Lowe, P.C.

(57) ABSTRACT

The present application discloses a semiconductor device with graphene layers and a method for fabricating the semiconductor device. The semiconductor device includes a substrate, a first passivation layer positioned above the substrate, a redistribution layer positioned on the first passivation layer, a first adjustment layer positioned on the redistribution layer, a pad layer positioned on the first adjustment layer, and a second adjustment layer positioned between the pad layer and the first adjustment layer. The first adjustment layer and the second adjustment layer are formed of graphene.

18 Claims, 22 Drawing Sheets

SEMICONDUCTOR DEVICE WITH GRAPHENE LAYERS AND METHOD FOR FABRICATING THE SAME

TECHNICAL FIELD

The present disclosure relates to a semiconductor device and a method for fabricating the semiconductor device, and more particularly, to a semiconductor device with graphene layers and the method for fabricating the semiconductor device with the graphene layers.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first passivation layer positioned above the substrate, a redistribution layer positioned on the first passivation layer, a first adjustment layer positioned on the redistribution layer, a pad layer positioned on the first adjustment layer, and a second adjustment layer positioned between the pad layer and the first adjustment layer. The first adjustment layer and the second adjustment layer are formed of graphene.

In some embodiments, the pad layer includes a lower portion positioned on the first adjustment layer and an upper portion positioned on the lower portion.

In some embodiments, the second adjustment layer is positioned between the lower portion of the pad layer and the first adjustment layer, positioned on sidewalls of the lower portion of the pad layer, and positioned on bottom surfaces of the upper portion of the pad layer.

In some embodiments, the semiconductor device includes a second passivation layer positioned on the first passivation layer. The redistribution layer and the lower portion of the pad layer are positioned in the second passivation layer, and the upper portion of the pad layer is positioned on the second passivation layer.

In some embodiments, the second passivation layer includes a lower layer positioned on the first passivation layer and an upper layer positioned on the lower layer, the redistribution layer is positioned in the lower layer of the second passivation layer, and the lower portion of the pad layer is positioned along the upper layer of the second passivation layer and extending to the lower layer of the second passivation layer.

In some embodiments, the lower layer of the second passivation layer is formed of silicon oxide or phosphosilicate glass and the upper layer of the second passivation layer is formed of silicon nitride, silicon oxynitride, or silicon oxide nitride.

In some embodiments, the semiconductor device includes a first barrier layer positioned between the redistribution layer and the first passivation layer.

In some embodiments, the semiconductor device includes a second barrier layer positioned between the redistribution layer and the first adjustment layer.

In some embodiments, the semiconductor device includes a third barrier layer positioned between the pad layer and the second adjustment layer.

In some embodiments, the first barrier layer is formed of titanium, titanium nitride, titanium silicon nitride, tantalum, tantalum nitride, tantalum silicon nitride, or a combination thereof.

In some embodiments, the semiconductor device includes a topmost conductive line positioned in the first passivation layer and a conductive via electrically connecting the redistribution layer and the topmost conductive line.

In some embodiments, the first passivation layer includes a bottom layer positioned above the substrate and a top layer positioned on the bottom layer, the topmost conductive line is positioned in the bottom layer of the first passivation layer, and the conductive via is positioned along the top layer of the first passivation layer and extending to the bottom layer of the first passivation layer.

In some embodiments, the semiconductor device includes first spacers positioned on sidewalls of the first adjustment layer and sidewalls of the redistribution layer.

In some embodiments, the semiconductor device includes a bump unit positioned on the pad layer.

In some embodiments, the semiconductor device includes an under bump metallization layer positioned between the bump unit and the pad layer.

In some embodiments, the semiconductor device includes porous spacers positioned on sidewalls of the first adjustment layer and sidewalls of the redistribution layer.

In some embodiments, a porosity of the porous spacers is between about 50% and about 100%.

Another aspect of the present disclosure provides a method for fabricating a semiconductor device including providing a substrate, forming a redistribution layer above the substrate, forming a first adjustment layer on the redistribution layer, forming a second adjustment layer on the first adjustment layer, and forming a pad layer on the second adjustment layer. The first adjustment layer and the second adjustment layer are formed of graphene.

In some embodiments, the method for fabricating the semiconductor device includes a step of forming first spacers on sidewalls of the first adjustment layer and on sidewalls of the redistribution layer.

In some embodiments, the method for fabricating the semiconductor device includes a step of forming a first barrier layer above the substrate, wherein the redistribution layer is formed on the first barrier layer.

Due to the design of the semiconductor device of the present disclosure, the first adjustment layer and the second adjustment layer may reduce the resistance between the pad layer and the redistribution layer. Therefore, the power consumption of the semiconductor device may be decreased. In other words, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
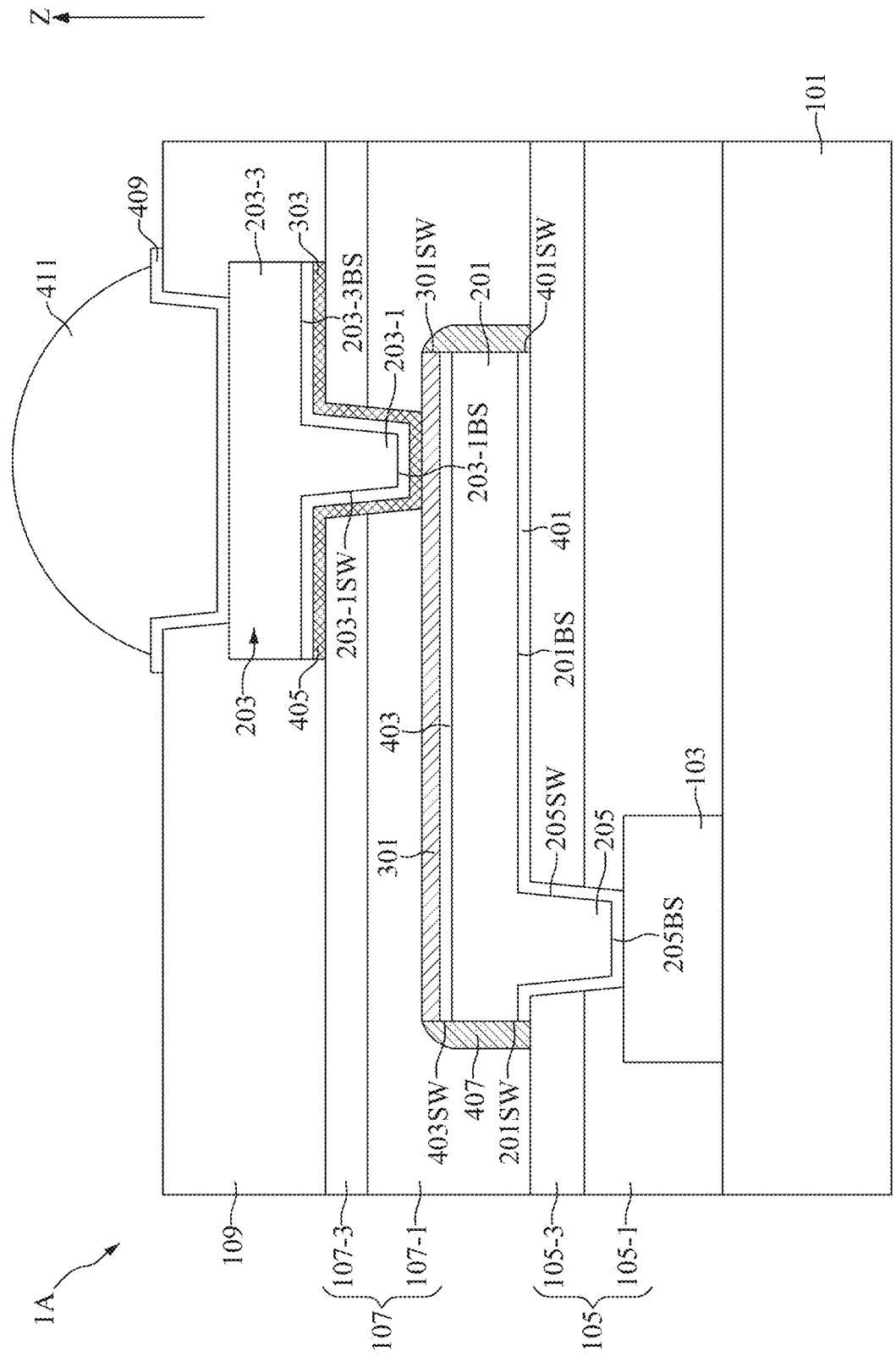
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device 1A in accordance with one embodiment of the present disclosure.

With reference to FIG. 1, the semiconductor device 1A may include a substrate 101, a topmost conductive line 103, a first passivation layer 105, a second passivation layer 107, a third passivation layer 109, a redistribution layer 201, a pad layer 203, a first adjustment layer 301, a second adjustment layer 303, a first barrier layer 401, a second barrier layer 403, a third barrier layer 405, first spacers 407, an under bump metallization layer 409, and a bump unit 411.

With reference to FIG. 1, in some embodiments, the substrate 101 may be a bulk semiconductor substrate that is composed entirely of at least one semiconductor material; the bulk semiconductor substrate does not contain any dielectrics, insulating layers, or conductive features. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; a non-semiconductor material, such as soda-lime glass, fused silica, fused quartz, calcium fluoride; other suitable materials; or combinations thereof.

In some embodiments, the substrate 101 may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. The insulator layer may have a thickness between about 10 nm and 200 nm.

In some embodiments, the substrate 101 may include dielectrics, insulating layers, or conductive features disposed on the bulk semiconductor substrate or the topmost semiconductor material layer. The dielectrics or the insulating layers may include, for example, a semiconductor oxide, a semiconductor nitride, semiconductor oxynitride, semiconductor carbide, tetraethyl orthosilicate oxide, phosphosilicate glass, borophosphosilicate glass, fluorinated silica glass, carbon doped silicon oxide, xerogel, aerogel, amorphous fluorinated carbon, parylene, bis-benzocyclobutenes, polyimide, or combinations thereof. The conductive features may be conductive lines, conductive vias, conductive contacts, or the like. The dielectrics or the insulating layers may act as an insulator that supports and electrically isolates the conductive features.

In some embodiments, device elements (not shown) may be disposed in the substrate 101. The device elements may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements may be electrically insulated from neighboring device elements by insulating structures such as shallow trench isolation.

With reference to FIG. 1, the first passivation layer 105 may be disposed on the substrate 101. In some embodiments, the first passivation layer 105 may include a bottom layer 105-1 and a top layer 105-3. The bottom layer 105-1 of the first passivation layer 105 may be disposed on the substrate 101. The top layer 105-3 of the first passivation layer 105 may be disposed on the bottom layer 105-1 of the first passivation layer 105. The bottom layer 105-1 of the first passivation layer 105 may be formed of, for example, silicon oxide or phosphosilicate glass. The top layer 105-3 of the first passivation layer 105 may be formed of, for example, silicon nitride, silicon oxynitride, or silicon oxide nitride. The bottom layer 105-1 of the first passivation layer 105 may serve as a stress buffer between the top layer 105-3 of the first passivation layer 105 and the substrate 101. The top layer 105-3 of the first passivation layer 105 may serve as a high vapor barrier in order to prevent moisture from entering from above.

In some embodiments, the first passivation layer 105 may be formed of, for example, silicon oxide, silicon nitride, silicon oxynitride, silicon oxide nitride, polyimide, polybenzoxazole, phosphosilicate glass, undoped silica glass, or fluoride silicate glass.

It should be noted that, in description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, in some embodiments, the topmost conductive line 103 may be disposed in the first passivation layer 105. In some embodiments, the topmost conductive line 103 may be disposed in the bottom layer 105-1 of the first passivation layer 105 and disposed on the substrate 101. The topmost conductive line 103 may be formed of, for example, copper, aluminum, titanium, tungsten, the like, or a combination thereof.

With reference to FIG. 1, the second passivation layer 107 may be disposed on the first passivation layer 105. In some embodiments, the second passivation layer 107 may include a lower layer 107-1 and an upper layer 107-3. The lower layer 107-1 of the second passivation layer 107 may be disposed on the top layer 105-3 of the first passivation layer 105. The upper layer 107-3 of the second passivation layer 107 may be disposed on the lower layer 107-1 of the second passivation layer 107. The lower layer 107-1 of the second passivation layer 107 may be formed of, for example, silicon oxide or phosphosilicate glass. The upper layer 107-3 of the second passivation layer 107 may be formed of, for example, silicon nitride, silicon oxynitride, or silicon oxide nitride. The upper layer 107-3 of the second passivation layer 107 may serve as a high vapor barrier in order to prevent moisture from entering from above.

In some embodiments, the second passivation layer 107 may be formed of, for example, silicon oxide, silicon nitride, silicon oxynitride, silicon oxide nitride, polyimide, polybenzoxazole, phosphosilicate glass, undoped silica glass, or fluoride silicate glass.

With reference to FIG. 1, in some embodiments, the redistribution layer 201 may be disposed in the second passivation layer 107. In some embodiments, the redistribution layer 201 may be disposed in the lower layer 107-1 of the second passivation layer 107 and disposed on the top layer 105-3 of the first passivation layer 105.

The redistribution layer 201 may be formed of, for example, tungsten, titanium, tin, nickel, copper, gold, aluminum, platinum, cobalt, or a combination thereof. The redistribution layer 201 may be electrically coupled to the topmost conductive line 103. The redistribution layer 201 may re-route the topmost conductive line 103 to gain more space for wiring and prevent the topmost conductive line 103 being affect by the stress of wiring or bumping.

With reference to FIG. 1, in some embodiments, the conductive via 205 may be disposed between the redistribution layer 201 and the topmost conductive line 103. In some embodiments, the conductive via 205 may be disposed along the top layer 105-3 of the top layer 105-3 and extending to the bottom layer 105-1 of the first passivation layer 105. In some embodiments, the sidewalls 205SW of the conductive via 205 may have a slanted cross-sectional profile. In some embodiments, a width of the conductive via 205 may gradually become wider from bottom to top along the direction Z. In some embodiments, the conductive via 205 as a whole may have a uniform slope.

The conductive via 205 may electrically connect the redistribution layer 201 and the topmost conductive line 103. The conductive via 205 may be formed of, for example, tungsten, titanium, tin, nickel, copper, gold, aluminum, platinum, cobalt, or a combination thereof.

With reference to FIG. 1, in some embodiments, the first barrier layer 401 may be disposed between the conductive via 205 and the first passivation layer 105, between the conductive via 205 and the topmost conductive line 103, and between the redistribution layer 201 and the first passivation layer 105. In some embodiments, the first barrier layer 401 may be disposed on the on the sidewalls 205SW of the conductive via 205, on the bottom surface 205BS of the conductive via 205, and on the bottom surface 201BS of the redistribution layer 201. In some embodiments, the first barrier layer 401 may have a thickness between about 10 angstroms and about 15 angstroms. In some embodiments, the first barrier layer 401 may have a thickness between about 11 angstroms and about 13 angstroms.

The first barrier layer 401 may be formed of, for example, titanium, titanium nitride, titanium silicon nitride, tantalum, tantalum nitride, tantalum silicon nitride, or a combination thereof. The first barrier layer 401 may serve as an adhesive layer between the conductive via 205 and the topmost conductive line 103. The first barrier layer 401 may also prevent metal ions of the conductive via 205 or the redistribution layer 201 diffusing into the first passivation layer 105.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

With reference to FIG. 1, the first adjustment layer 301 may be disposed on the redistribution layer 201 and disposed in the lower layer 107-1 of the second passivation layer 107. In some embodiments, the first adjustment layer 301 may be formed of, for example, a material including $sp^2$ hybridized carbon atoms. In some embodiments, the first adjustment layer 301 may be formed of, for example, a material including carbons having hexagonal crystal structures. In some embodiments, the first adjustment layer 301 may be formed of, for example, graphene, graphite, or the like. In some embodiments, the first adjustment layer 301 may be formed of, for example, graphene. As the first adjustment layer 301 formed of graphene has excellent electrical conductivity, the resistance between the redistribution layer 201 and the pad layer 203, which will be illustrated later, can be reduced. Therefore, the power consumption for the semiconductor device 1A may be decreased.

With reference to FIG. 1, in some embodiments, the second barrier layer 403 may be disposed between the first adjustment layer 301 and the redistribution layer 201. In some embodiments, the second barrier layer 403 may be disposed on the redistribution layer 201 and the first adjustment layer 301 may be disposed on the second barrier layer 403. The second barrier layer 403 may have a thickness between about 10 angstroms and about 15 angstroms; specifically, between about 11 angstroms and about 13 angstroms.

The second barrier layer 403 may be formed of, for example, titanium, titanium nitride, titanium silicon nitride, tantalum, tantalum nitride, tantalum silicon nitride, or a combination thereof. The second barrier layer 403 may serve as an adhesive layer between the first adjustment layer 301 and the redistribution layer 201. The second barrier layer 403 may also prevent metal ions of the redistribution layer 201 diffusing into the second passivation layer 107 or the first adjustment layer 301.

With reference to FIG. 1, the first spacers 407 may be disposed on the sidewalls 301SW of the first adjustment layer 301, on the sidewalls 403SW of the second barrier layer 403, on the sidewalls 201SW of the redistribution layer 201, and on the sidewalls 401SW of the first barrier layer 401. The first spacers 407 may be disposed in the lower layer 107-1 of the second passivation layer 107.

The first spacers 407 may be formed of, for example, silicon oxide, silicon nitride, silicon carbon nitride, silicon nitride oxide, or silicon oxynitride. The first spacers 407 may electrically isolate the first adjustment layer 301, the second barrier layer 403, the redistribution layer 201, and the first barrier layer 401 from neighboring conductive features disposed adjacent to two sides of the redistribution layer 201.

With reference to FIG. 1, the third passivation layer 109 may be disposed on the upper layer 107-3 of the second passivation layer 107. The third passivation layer 109 may be formed of, for example, silicon nitride, silicon oxynitride, silicon oxide nitride, polyimide, polybenzoxazole, or a combination thereof. The third passivation layer 109 may seal and protect the elements disposed within the third passivation layer 109 and underneath the third passivation layer 109 from damage and contamination.

With reference to FIG. 1, in some embodiments, the pad layer 203 may be disposed on the first adjustment layer 301. In some embodiments, the pad layer 203 may include a lower portion 203-1 and an upper portion 203-3. The lower portion 203-1 of the pad layer 203 may be disposed along the upper layer 107-3 of the second passivation layer 107 and extending to the lower layer 107-1 of the second passivation layer 107. The bottom surface 203-1BS of the lower portion 203-1 of the pad layer 203 may be disposed on the first adjustment layer 301. The upper portion 203-3 of the pad layer 203 may be disposed on the lower portion 203-1 of the pad layer 203 and disposed in the third passivation layer 109.

In some embodiments, the pad layer 203 may be formed of, for example, aluminum, copper, aluminum-copper alloy, aluminum alloy, or copper alloy. In some embodiments, the upper portion 203-3 of the pad layer 203 may be a stacked structure including a bottom film and a top film. The bottom film may include nickel. The top film may include palladium, cobalt, or a combination thereof.

With reference to FIG. 1, in some embodiments, the second adjustment layer 303 may be disposed between the first adjustment layer 301 and the pad layer 203 and between the second passivation layer 107 and the pad layer 203. In some embodiments, the second adjustment layer 303 may be disposed on the bottom surface 203-1BS of the lower portion 203-1 of the pad layer 203, on the sidewalls 203-1SW of the lower portion 203-1 of the pad layer 203, and on the bottom surface 203-3BS of the upper portion 203-3 of the pad layer 203. In some embodiments, the second adjustment layer 303 may have a same thickness as the first adjustment layer 301. In some embodiments, the first adjustment layer 301 and the second adjustment layer 303 may have different thicknesses.

In some embodiments, the second adjustment layer 303 may be formed of, for example, a material including $sp^2$ hybridized carbon atoms. In some embodiments, the second adjustment layer 303 may be formed of, for example, a material including carbons having hexagonal crystal structures. In some embodiments, the second adjustment layer 303 may be formed of, for example, graphene, graphite, or the like. In some embodiments, the second adjustment layer 303 may be formed of, for example, graphene. As the second adjustment layer 303 formed of graphene has excellent electrical conductivity, the second adjustment layer 303 may further reduce the resistance between the redistribution layer 201 and the pad layer 203. Therefore, the power consumption for the semiconductor device 1A may be further decreased.

With reference to FIG. 1, the third barrier layer 405 may be disposed between the second adjustment layer 303 and the pad layer 203. The third barrier layer 405 may be formed of, for example, titanium, titanium nitride, tantalum, tantalum nitride, or titanium/titanium nitride bi-layer. The third barrier layer 405 may serve as an adhesive layer between the second adjustment layer 303 and the pad layer 203. The third barrier layer 405 may also prevent metal ions of the pad layer 203 diffusing into the second passivation layer 107 or the second adjustment layer 303.

With reference to FIG. 1, the bump unit 411 may be disposed on the pad layer 203. The lower portion of the bump unit 411 may be disposed in the third passivation layer 109 and disposed on the upper portion 203-3 of the pad layer 203. The upper portion of the bump unit 411 may be disposed on the third passivation layer 109. The bump unit 411 may be formed of, for example, a material including tin, silver, copper, gold, alloy or a combination thereof.

With reference to FIG. 1, the under bump metallization layer 409 may be disposed between the bump unit 411 and the upper portion 203-3 of the pad layer 203. The under bump metallization layer 409 may be a single layer structure or a stacked structure of multiple layers. For example, the under bump metallization layer 409 may include a first conductive layer, a second conductive layer, and a third conductive layer stacked sequentially. The first conductive layer may serve as an adhesive layer for stably attaching the bump unit 411 to the pad layer 203 and the third passivation layer 109. For example, the first conductive layer may include at least one of titanium, titanium-tungsten, chromium, and aluminum. The second conductive layer may serve as a barrier layer for preventing a conductive material contained in the under bump metallization layer 409 from diffusing into the pad layer 203 or the third passivation layer 109. The second conductive layer may include at least one of copper, nickel, chromium-copper, and nickel-vanadium. The third conductive layer may serve as a seed layer for forming the bump unit 411 or as a wetting layer for improving wetting characteristics of the bump unit 411. The third conductive layer may include at least one of nickel, copper, and aluminum.

Figure 2:
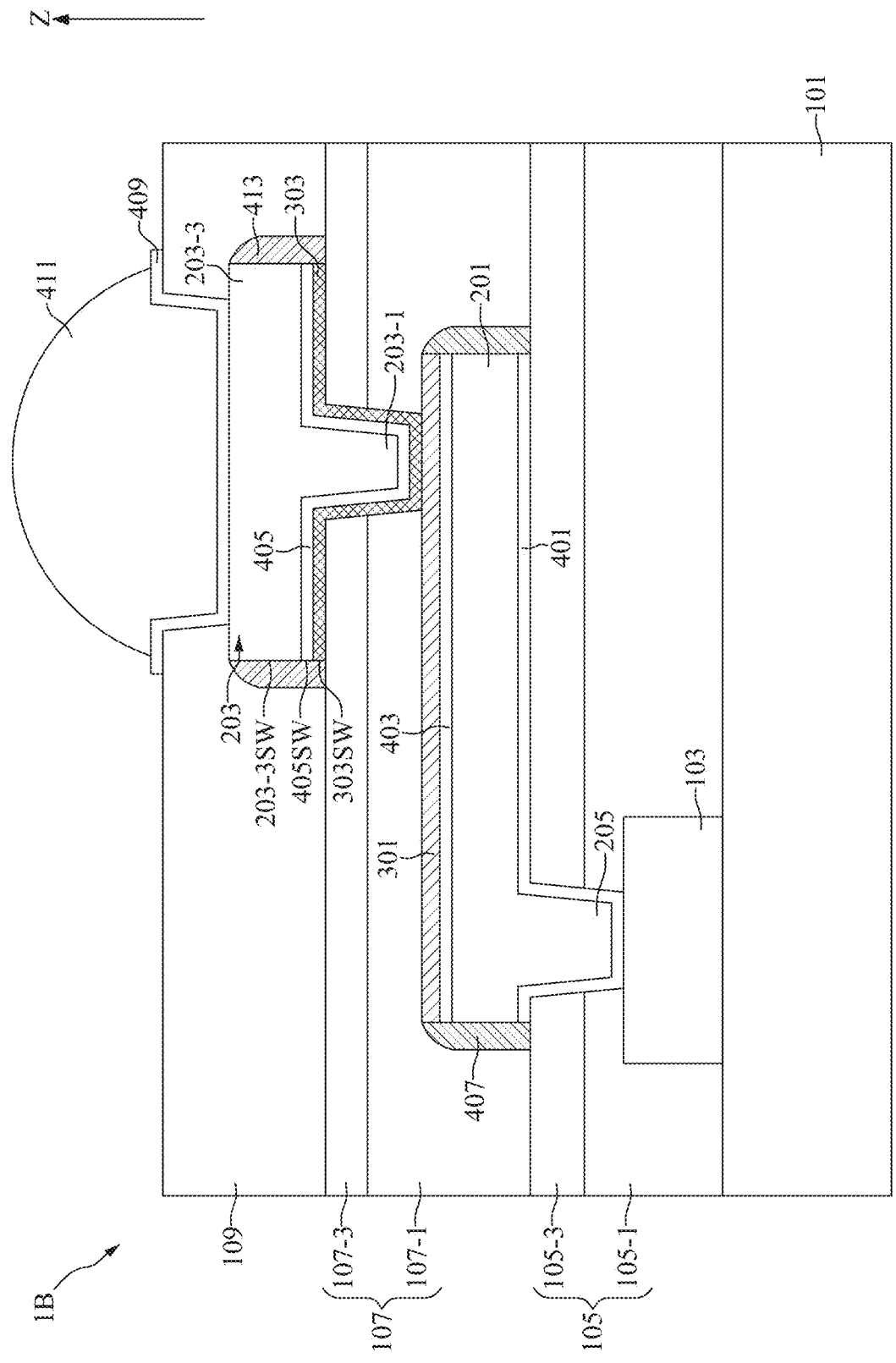
FIGS. 2 to 4 illustrate, in schematic cross-sectional view diagrams, semiconductor devices in accordance with some embodiments of the present disclosure.
Figure 3:
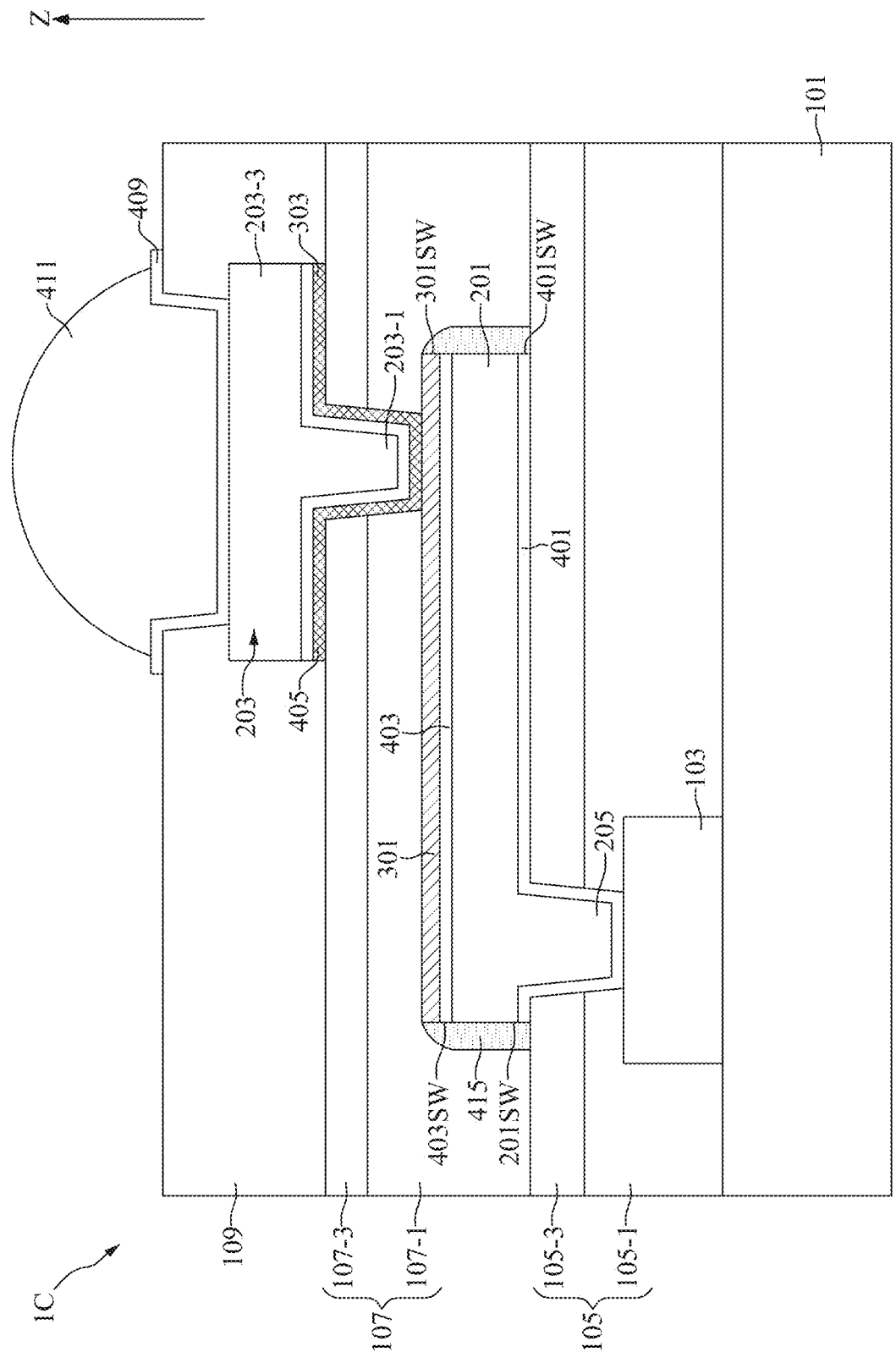
Figure 4:
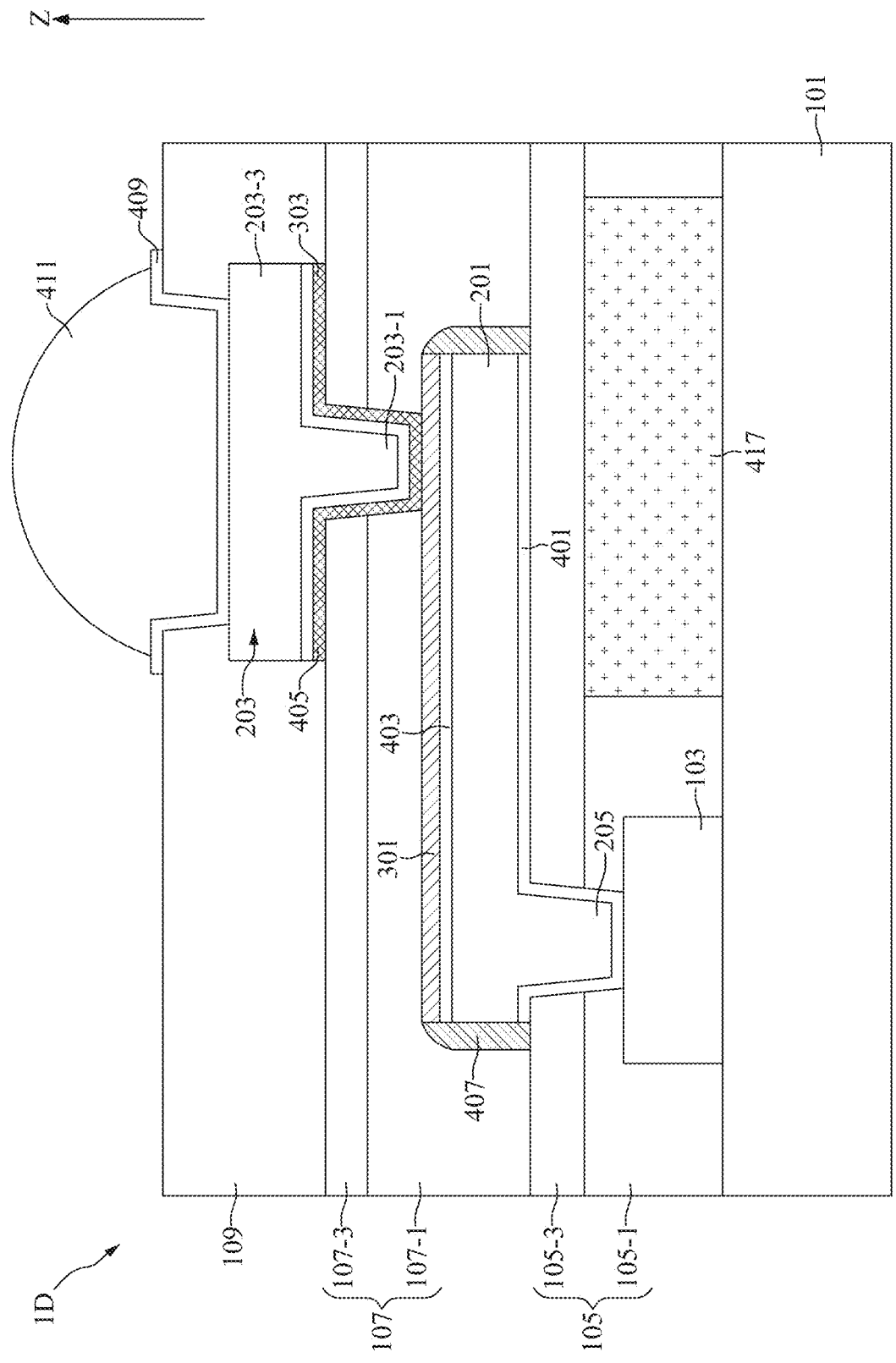

FIGS. 2 to 4 illustrate, in schematic cross-sectional view diagrams, semiconductor devices 1B, 1C, and 1D in accordance with some embodiments of the present disclosure.

With reference to FIG. 2, the semiconductor device 1B may have a structure similar to that illustrated in FIG. 1. The same or similar elements in FIG. 2 as in FIG. 1 have been marked with similar reference numbers and duplicative descriptions have been omitted.

With reference to FIG. 2, the semiconductor device 1B may include second spacers 413. The second spacers 413 may be disposed on sidewalls of the upper portion 203-3 of the pad layer 203, on sidewalls of the third barrier layer 405, and on sidewalls of the second adjustment layer 303.

The second spacers 413 may be formed of, for example, silicon oxide, silicon nitride, silicon carbon nitride, silicon nitride oxide, or silicon oxynitride. The second spacers 413 may electrically isolate the upper portion 203-3 of the pad layer 203, the third barrier layer 405, and the second adjustment layer 303 from neighboring conductive features disposed adjacent to two sides of the upper portion 203-3 of the pad layer 203.

With reference to FIG. 3, the semiconductor device 1C may have a structure similar to that illustrated in FIG. 1. The same or similar elements in FIG. 3 as in FIG. 1 have been marked with similar reference numbers and duplicative descriptions have been omitted.

With reference to FIG. 3, porous spacers 415 may be disposed on the sidewalls 301SW of the first adjustment layer 301, on the sidewalls 403SW of the second barrier layer 403, on the sidewalls 201SW the redistribution layer 201, and on the sidewalls 401SW of the first barrier layer 401. The porous spacers 415 may be disposed in the lower layer 107-1 of the second passivation layer 107.

The porous spacers 415 may be formed from an energy-removable material. The porous spacers 415 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. In some embodiments, the porous spacers 415 may have a porosity between about 50% and about 100%. In some embodiments, the porosity of the porous spacers 415 may be between about 60% and about 90%. The plurality of empty spaces of the porous spacers 415 may be filled with air. As a result, a dielectric constant of the porous spacers 415 may be significantly lower than a layer formed of, for example, silicon oxide. Therefore, the porous spacers 415 may significantly reduce the parasitic capacitance of the redistribution layer 201. That is, the porous spacers 415 may significantly alleviate an interference effect between electrical signals induced or applied to the redistribution layer 201.

It should be noted that the porosity of the porous spacers 415 may be 100% which means the porous spacers 415 includes only empty spaces and the porous spacers 415 may be regarded as air gaps.

The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source.

It should be noted that, the term "about" modifying the quantity of an ingredient, component, or reactant of the present disclosure refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

With reference to FIG. 4, the semiconductor device 1D may have a structure similar to that illustrated in FIG. 1. The same or similar elements in FIG. 4 as in FIG. 1 have been marked with similar reference numbers and duplicative descriptions have been omitted.

With reference to FIG. 4, the semiconductor device 1D may include a stress-relief layer 417. The stress-relief layer 417 may be disposed in the bottom layer 105-1 of the first passivation layer 105. The stress-relief layer 417 may be disposed directly below the pad layer 203. The stress-relief layer 417 may be utilized to absorb and redistribute the stress concentrated on the underlying layers created by the shear stresses from thermal expansion mismatches and normal stresses due to a wiring process. The stress-relief layer 417 may be formed of, for example, a material having a coefficient of thermal expansion of less than about 20 ppm/° C. and a Young's Modulus of less than about 15 GPa.

Specifically, the stress-relief layer 417 may be formed of a material including polyimide or an epoxy-based material. The stress-relief layer 417 may have a thickness between about 5,000 angstroms and about 100,000 angstroms. Preferably, the thickness of the stress-relief layer 417 may be between about 10,000 angstroms and about 50,000 angstroms. The stress-relief layer 417 may serve as a cushion to reduce a stress of a bumping process or a wiring process; therefore, the delamination of the third passivation layer 109, the second passivation layer 107, and the first passivation layer 105 may be reduced.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 5:
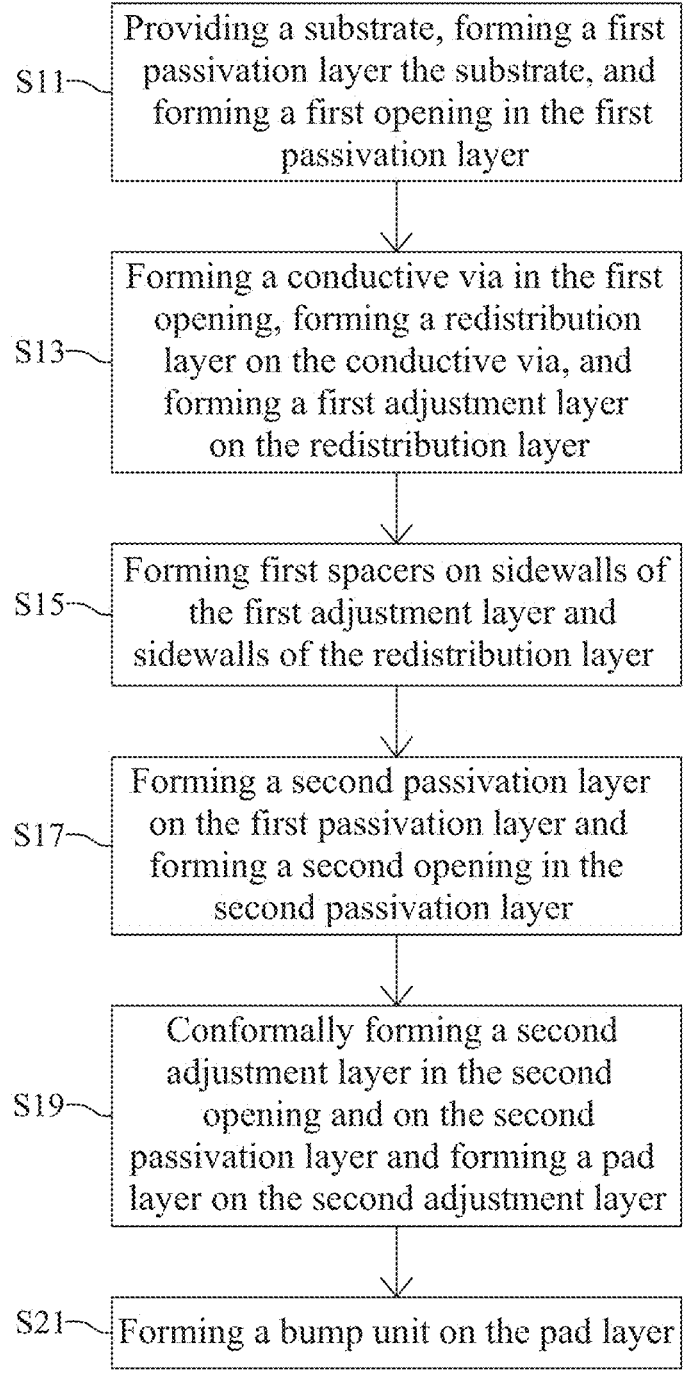
FIG. 5 illustrates, in a flowchart diagram form, a method for fabricating a semiconductor device in accordance with one embodiment of the present disclosure.

FIG. 5 illustrates, in a flowchart diagram form, a method 10 for fabricating a semiconductor device 1A in accordance with one embodiment of the present disclosure. FIGS. 6 to 18 illustrate, in schematic cross-sectional view diagrams, a flow for fabricating the semiconductor device 1A in accordance with one embodiment of the present disclosure.

Figure 6:
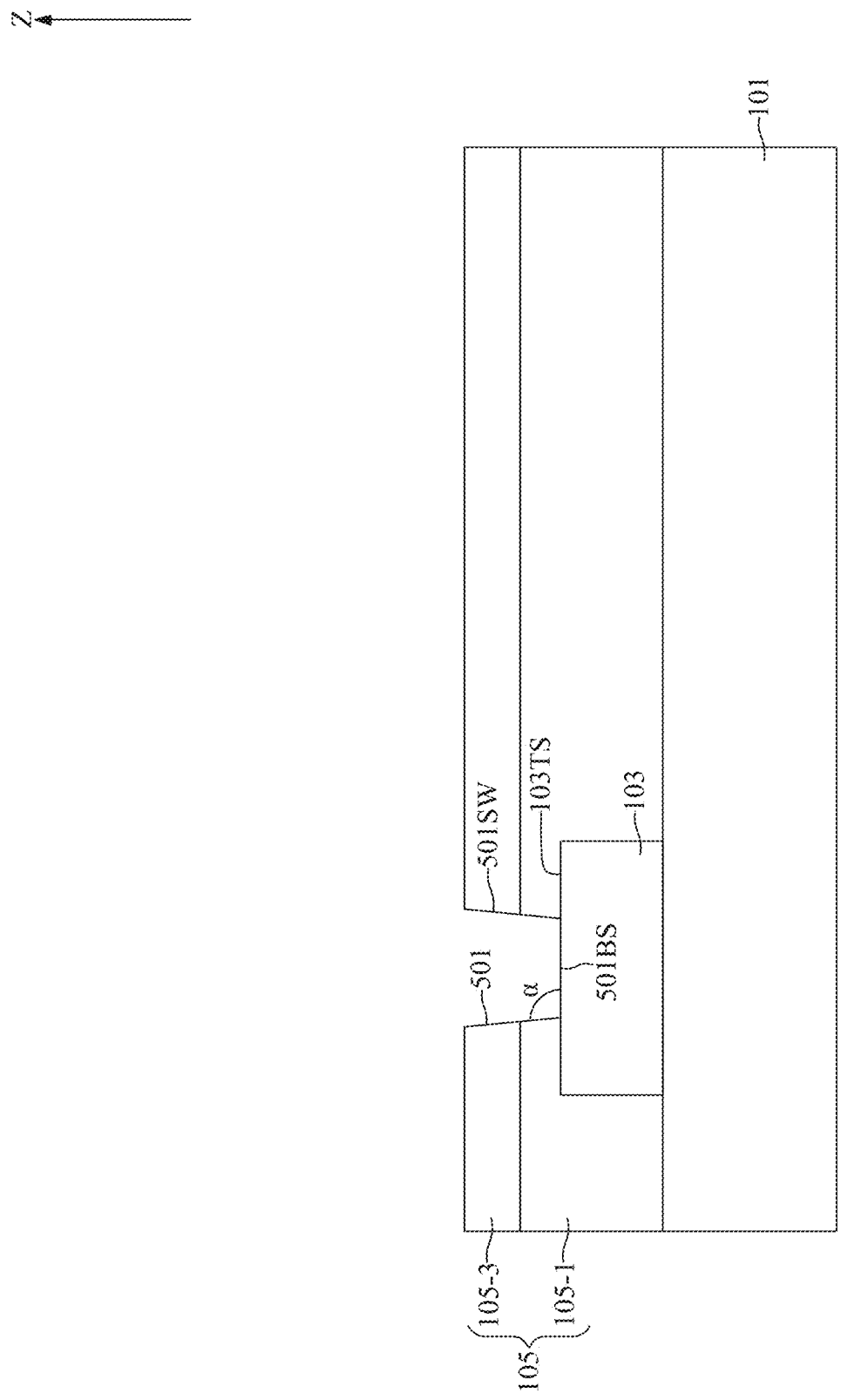
FIGS. 6 to 18 illustrate, in schematic cross-sectional view diagrams, a flow for fabricating the semiconductor device in accordance with one embodiment of the present disclosure.

With reference to FIGS. 5 and 6, at step S11, a substrate 101 may be provided, a first passivation layer 105 may be formed on the substrate 101, and a first opening 501 may be formed in the first passivation layer 105.

With reference to FIG. 6, a topmost conductive line 103 may be formed on the substrate 101. The first passivation layer 105 may include a bottom layer 105-1 and a top layer 105-3. The bottom layer 105-1 of the first passivation layer 105 may be formed to cover the substrate 101 and the topmost conductive line 103. The top layer 105-3 of the first passivation layer 105 may be formed on the bottom layer 105-1 of the first passivation layer 105. The bottom layer 105-1 and the top layer 105-3 of the first passivation layer 105 may be formed by deposition processes such as chemical vapor deposition, plasma enhanced chemical vapor deposition, evaporation, or spin-on coating. After the deposition of the bottom layer 105-1 of the first passivation layer 105, a planarization process, such as chemical mechanical polishing, may be performed to provide a substantially flat surface for subsequent processing steps.

With reference to FIG. 6, the first opening 501 may be formed by a photolithography process and a following anisotropic etch process. A portion of the top surface 103TS of the topmost conductive line 103 may be exposed through the first opening 501. In some embodiments, the sidewalls of the first opening 501 may be tapered. The angle α between the sidewalls of the first opening 501 and the bottom surface of the first opening 501 may be between about 90 degree and about 110 degree.

With reference to FIG. 5 and FIGS. 7 to 9, at step S13, a conductive via 205 may be formed in the first opening 501, a redistribution layer 201 may be formed on the conductive via 205, and a first adjustment layer 301 may be formed on the redistribution layer 201.

Figure 7:
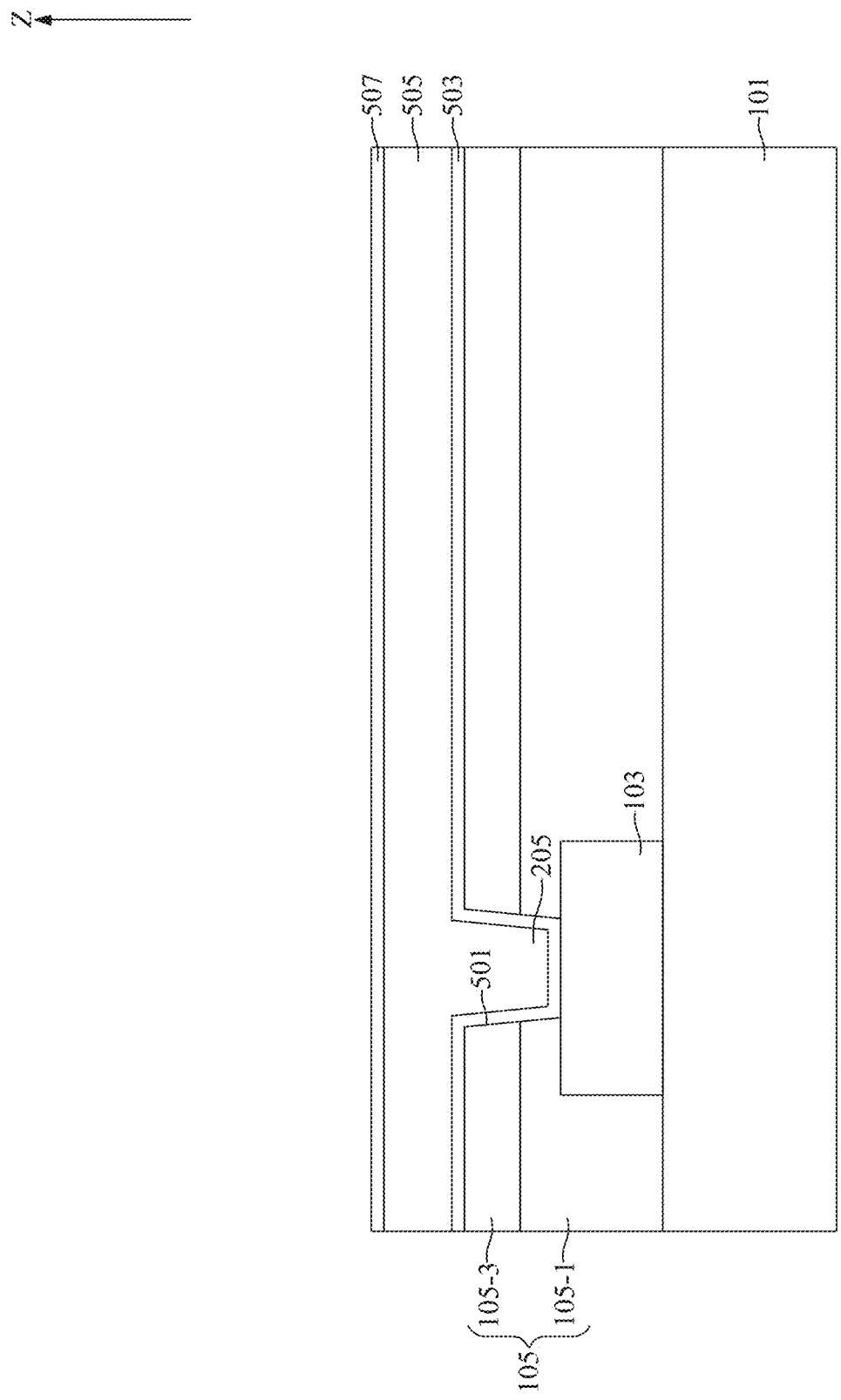

With reference to FIG. 7, a layer of first conductive material 503 may be conformally formed in the first opening 501 and on the top surface of the top layer 105-3 of the first passivation layer 105. The first conductive material 503 may be, for example, titanium, titanium nitride, titanium silicon nitride, tantalum, tantalum nitride, tantalum silicon nitride, or a combination thereof. The layer of first conductive material 503 may be formed by chemical vapor deposition, physical vapor deposition, evaporation, or sputtering.

In some embodiments, a cleaning process and a passivation process may be performed on the first opening 501 before the deposition of the layer of first conductive material 503. The cleaning process may remove oxide, originating from oxidation by oxygen in the air, from the top surface of the topmost conductive line 103 without damaging the topmost conductive line 103. The cleaning process may include applying a mixture of hydrogen and argon as a remote plasma source onto the first opening 501. A process temperature of the cleaning process may be between about 250° C. and about 350° C. A process pressure of the cleaning process may be between about 1 Torr and about 10 Torr. A bias energy may be applied to the equipment performing the cleaning process. The bias energy may be between about 0 W and 200 W.

The passivation process may include soaking the intermediate semiconductor device with a precursor such as dimethylaminotrimethylsilane, tetramethylsilane, or the like at a process temperature between about 200° C. and about 400° C. An ultraviolet radiation may be used to facilitate the passivation process. The passivation process may passivate sidewalls of the second passivation layer 107 exposed through the first opening 501 by sealing surface pores thereof. Undesirable sidewall growth, which may affect the electric characteristics of the semiconductor device 1A, may be reduced by the passivation process. As a result, the performance and reliability of the semiconductor device 1A may be increased.

With reference to FIG. 7, a layer of second conductive material 505 may be formed on the layer of first conductive material 503. The second conductive material 505 may completely fill the first opening 501 and cover the layer of first conductive material 503. The second conductive material 505 filled in the first opening 501 may be referred to as the conductive via 205. A planarization process, such as chemical mechanical polishing, may be performed to provide a substantially flat surface for subsequent processing steps. The second conductive material 505 may be, for example, tungsten, titanium, tin, nickel, copper, gold, aluminum, platinum, cobalt, or a combination thereof. The layer of second conductive material 505 may be formed by chemical vapor deposition, physical vapor deposition, evaporation, or sputtering.

With reference to FIG. 7, a layer of third conductive material 507 may be formed on the layer of second conductive material 505. The third conductive material 507 may be, for example, titanium, titanium nitride, titanium silicon nitride, tantalum, tantalum nitride, tantalum silicon nitride, or a combination thereof. The layer of third conductive material 507 may be formed by chemical vapor deposition, physical vapor deposition, evaporation, or sputtering.

Figure 8:
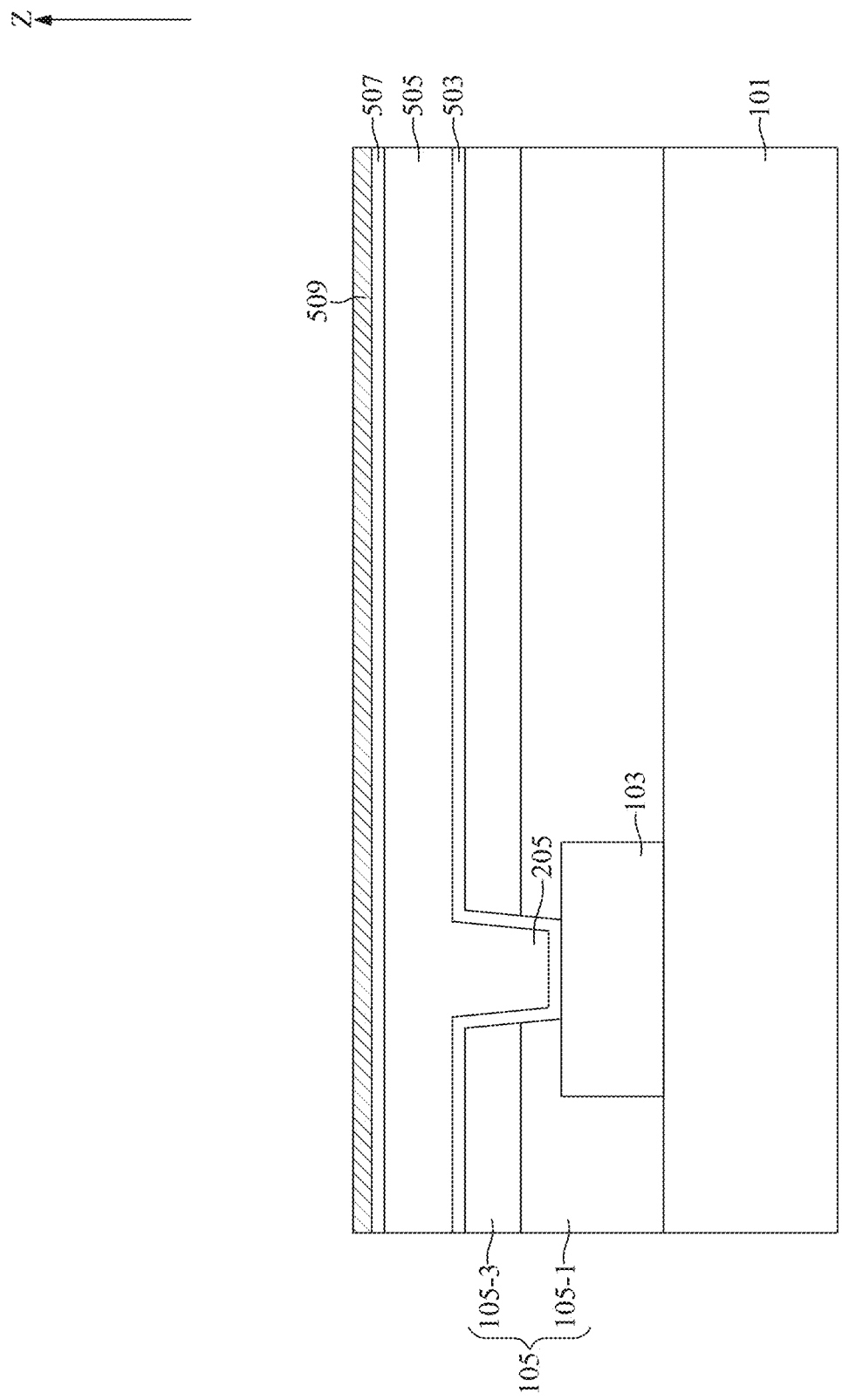

With reference to FIG. 8, a layer of fourth conductive material 509 may be formed on the layer of third conductive material 507. In some embodiments, the fourth conductive material 509 may be, for example, graphene, graphite, or the like.

In some embodiments, the layer of fourth conductive material 509 may be formed on a catalyst substrate and then transferred onto the intermediate semiconductor device illustrated in FIG. 7. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, a catalytic conductive layer (not shown for clarity) may be conformally formed on the layer of third conductive material 507. The layer of fourth conductive material 509 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the layer of fourth conductive material 509 may be formed with assistance of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

Figure 9:
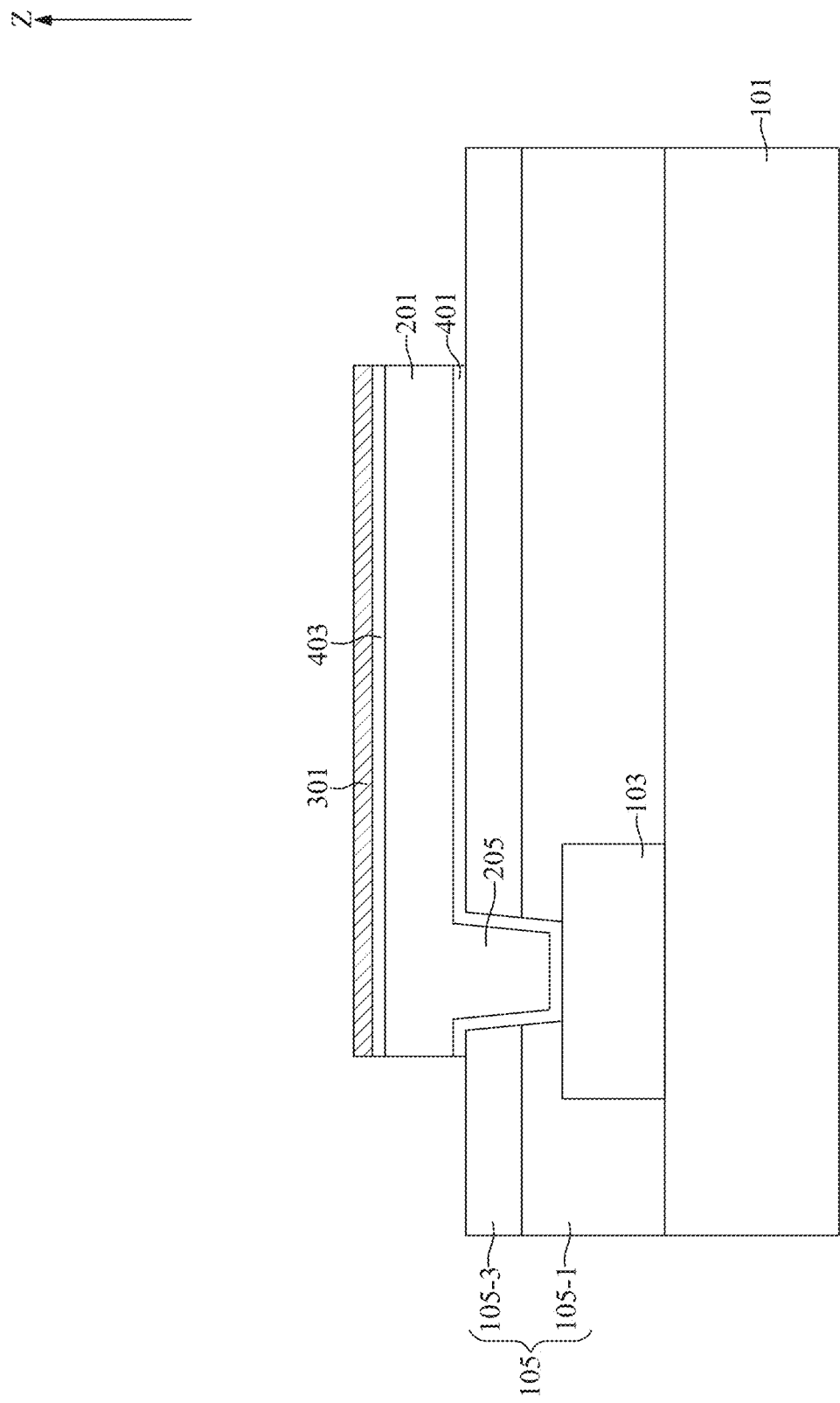

With reference to FIG. 9, a photolithography process may be performed to define the pattern of the redistribution layer 201. A following etch process may be performed to remove portions of the layer of fourth conductive material 509, the layer of third conductive material 507, the layer of second conductive material 505, and the layer of first conductive material 503 and concurrently form the first adjustment layer 301, the second barrier layer 403, the redistribution layer 201, and the first barrier layer 401. The following etch process may be an anisotropic dry etch process.

Figure 10:
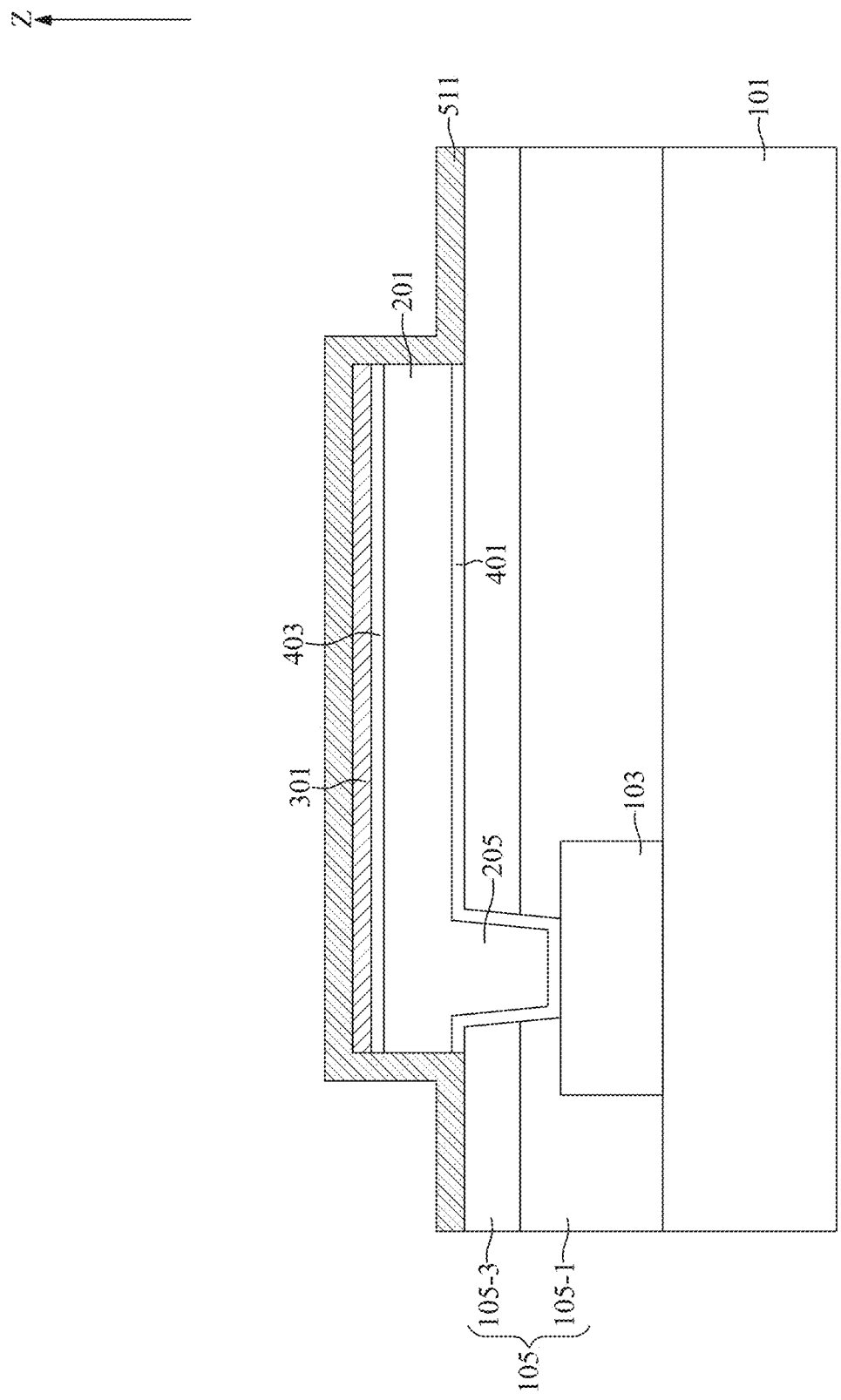
Figure 11:
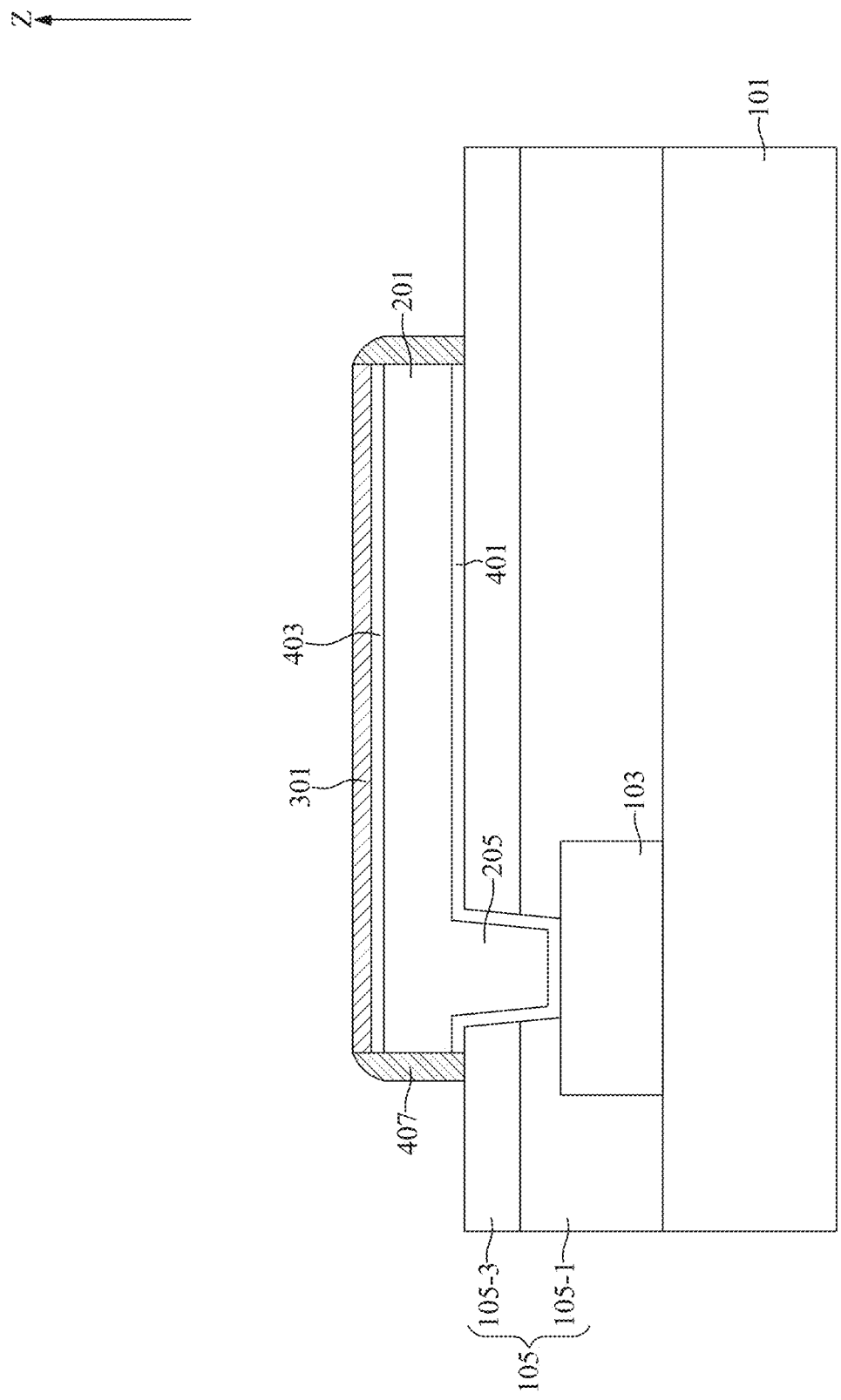

With reference to FIGS. 5, 10, and 11, at step S15, first spacers 407 may be formed on sidewalls of the first adjustment layer 301 and sidewalls of the redistribution layer 201.

With reference to FIG. 10, a layer first insulating material 511 may be formed over the intermediate semiconductor device illustrated in FIG. 9. The first insulating material 511 may be, for example, silicon oxide, silicon nitride, silicon carbon nitride, silicon nitride oxide, or silicon oxynitride. The layer first insulating material 511 may be formed by chemical vapor deposition, plasma enhanced chemical vapor deposition, or atomic layer deposition.

With reference to FIG. 11, an etch, for example, reactive ion etch process, may be performed to remove portions of the layer first insulating material 511 and concurrently form the first spacers 407.

Figure 12:
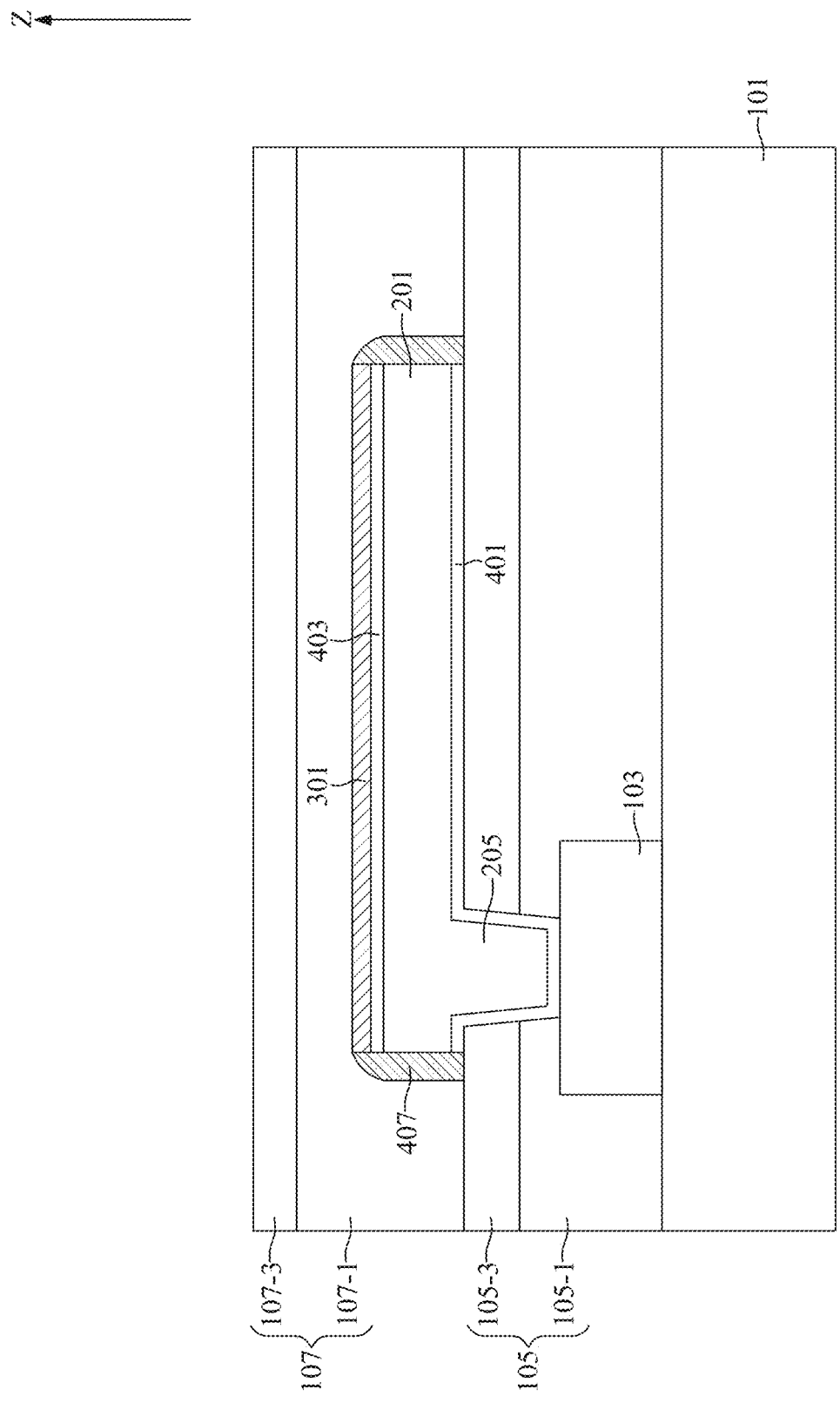
Figure 13:
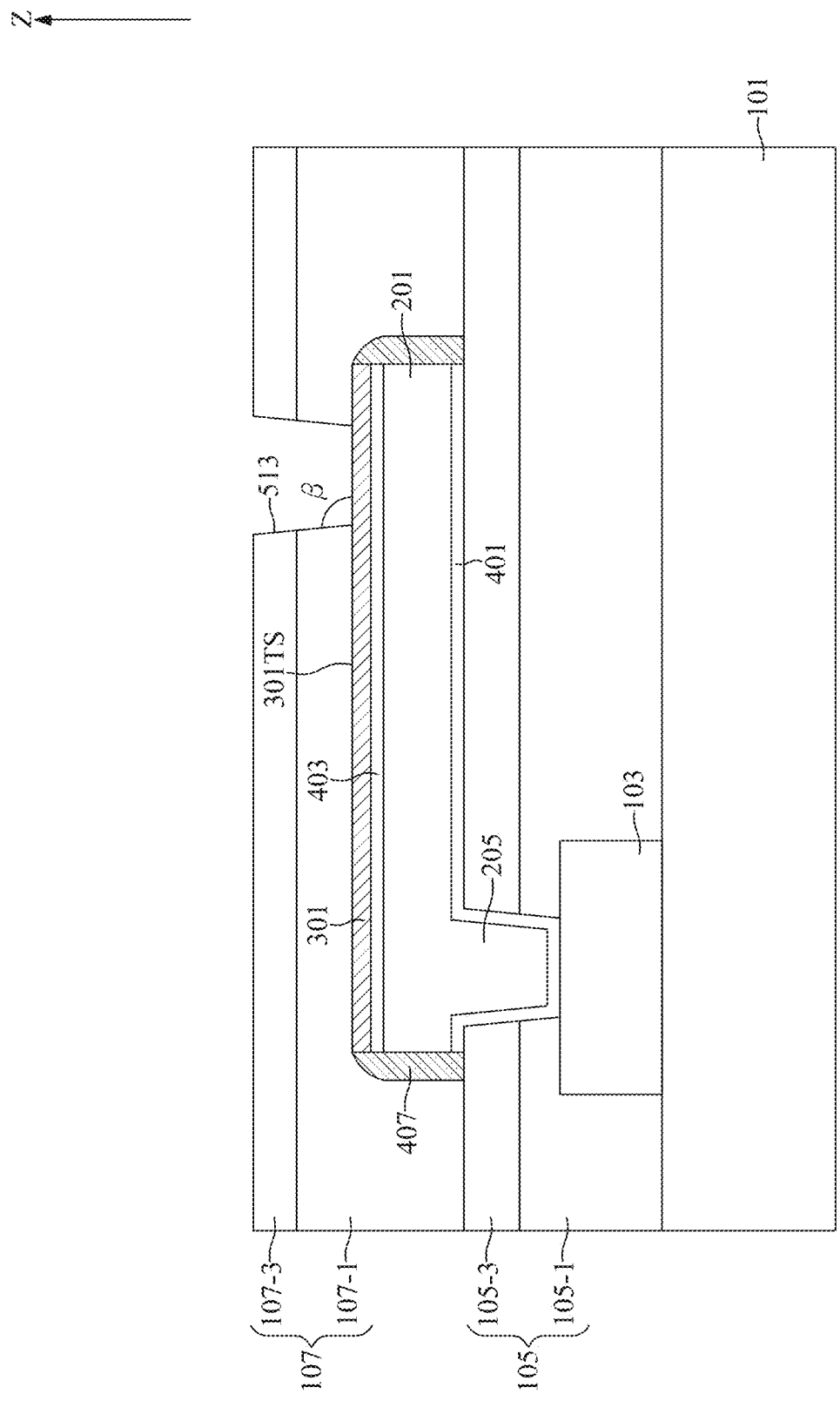

With reference to FIGS. 5, 12 and 13, at step S17, a second passivation layer 107 may be formed on the first passivation layer 105 and a second opening 513 may be formed in the second passivation layer 107.

With reference to FIG. 12, the second passivation layer 107 may include a lower layer 107-1 and an upper layer 107-3. The lower layer 107-1 of the second passivation layer 107 may be formed to cover the first adjustment layer 301 and the first spacers 407. The upper layer 107-3 of the second passivation layer 107 may be formed on the lower layer 107-1 of the second passivation layer 107. The lower layer 107-1 and the upper layer 107-3 of the second passivation layer 107 may be formed by deposition processes such as chemical vapor deposition, plasma enhanced chemical vapor deposition, evaporation, or spin-on coating. After the deposition of the lower layer 107-1 of the second passivation layer 107, a planarization process, such as chemical mechanical polishing, may be performed to provide a substantially flat surface for subsequent processing steps.

With reference to FIG. 13, the second opening 513 may be formed by a photolithography process and a following anisotropic etch process. A portion of the top surface 301TS of the first adjustment layer 301 may be exposed through the second opening 513. In some embodiments, the sidewalls of the second opening 513 may be tapered. The angle R between the sidewalls of the second opening 513 and the bottom surface of the second opening 513 may be between about 90 degree and about 110 degree.

With reference to FIG. 5 and FIGS. 14 to 16, at step S19, a second adjustment layer 303 may be conformally formed in the second opening 513 and on the second passivation layer 107, and a pad layer 203 may be formed on the second adjustment layer 303.

Figure 14:
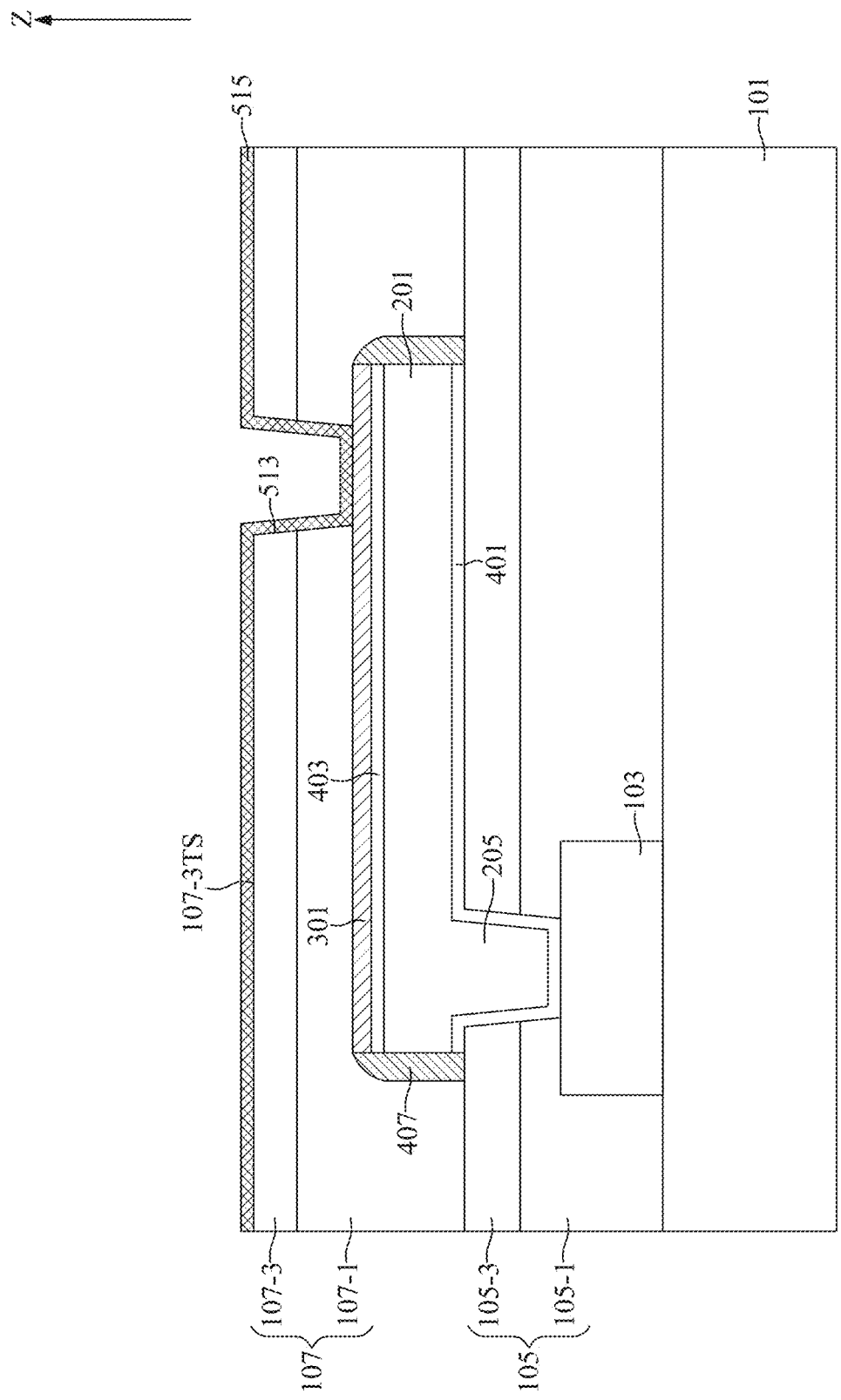

With reference to FIG. 14, a layer of fifth conductive material 515 may be conformally formed in the second opening 513 and on the top surface 107-3TS of the upper layer 107-3 of the second passivation layer 107. The fifth conductive material 515 may be the same material as the fourth conductive material 509. The layer of fifth conductive material 515 may be formed by a procedure similar to the layer of fourth conductive material 509 illustrated in FIG. 8.

In some embodiments, before the deposition of the layer of fifth conductive material 515, a cleaning process and a passivation process may be performed on the second opening 513 with a procedure similar to that illustrated in FIG. 7. It should be noted that the cleaning process and the passivation process may be optional.

Figure 15:
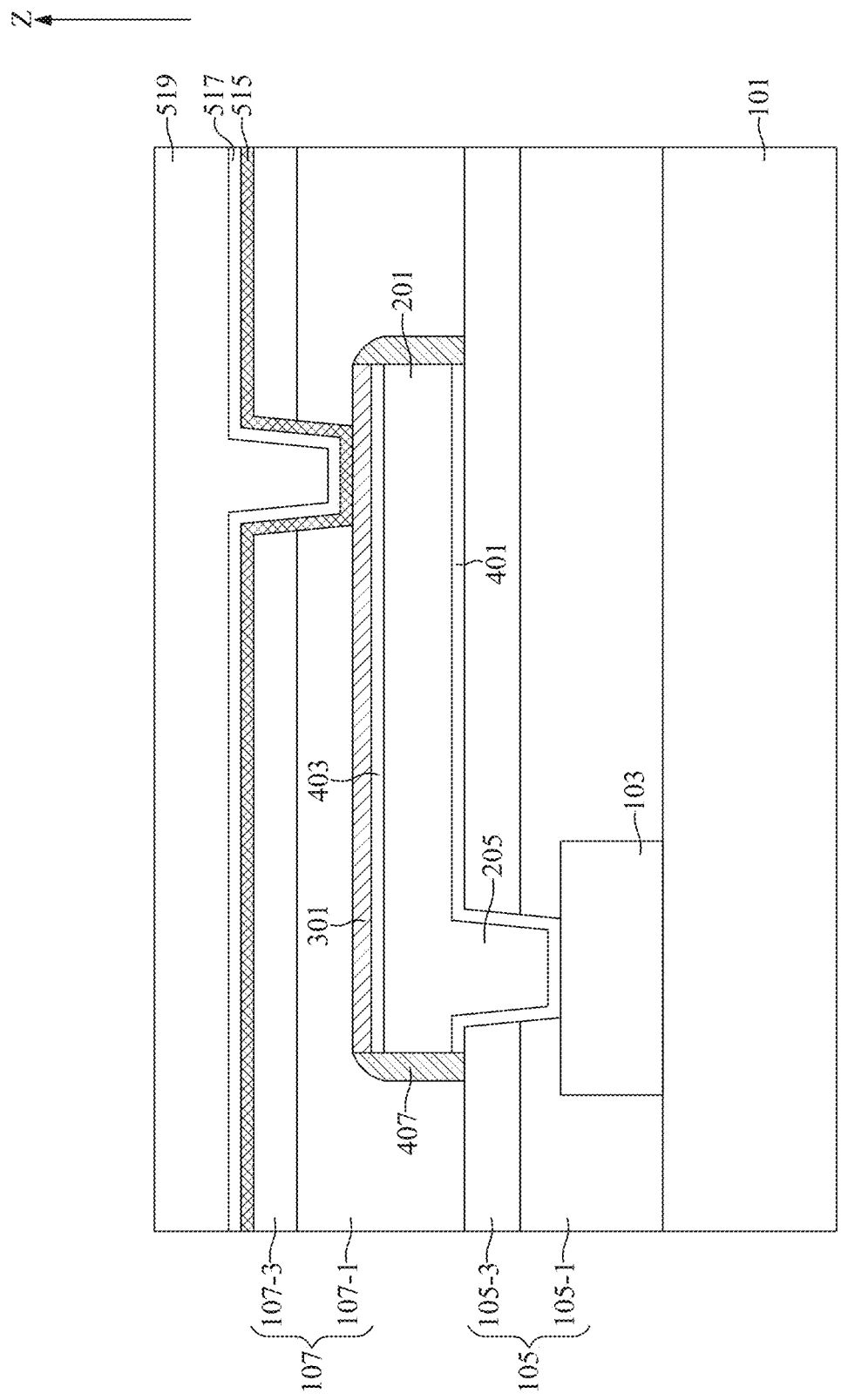

With reference to FIG. 15, a layer of sixth conductive material 517 may be conformally formed on the layer of fifth conductive material 515. The sixth conductive material 517 may be, for example, titanium, titanium nitride, titanium silicon nitride, tantalum, tantalum nitride, tantalum silicon nitride, or a combination thereof. The layer of sixth conductive material 517 may be formed by chemical vapor deposition, physical vapor deposition, evaporation, or sputtering.

With reference to FIG. 15, a layer of seventh conductive material 519 may be formed on the layer of sixth conductive material 517. The seventh conductive material 519 may completely fill the second opening 513 and cover the layer of sixth conductive material 517. A planarization process, such as chemical mechanical polishing, may be performed to provide a substantially flat surface for subsequent processing steps. The seventh conductive material 519 may be, for example, aluminum, copper, aluminum-copper alloy, aluminum alloy, or copper alloy. The layer of seventh conductive material 519 may be formed by chemical vapor deposition, physical vapor deposition, evaporation, sputtering, or electroplating.

Figure 16:
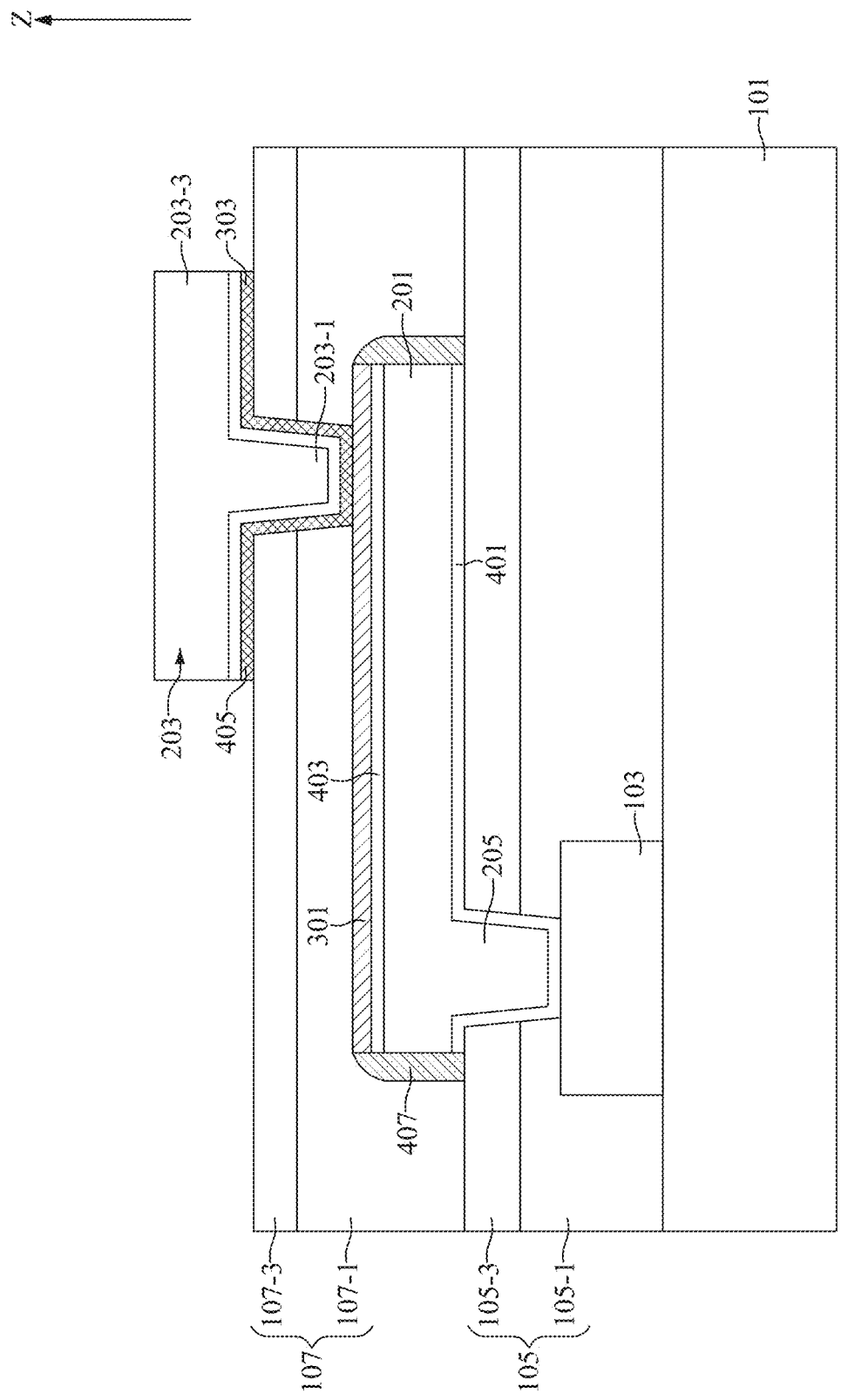

With reference to FIG. 16, a photolithography process may be performed to define the pattern of the pad layer 203. A following etch process may be performed to remove portions of the layer of seventh conductive material 519, the layer of sixth conductive material 517, and the layer of fifth conductive material 515 and concurrently form the pad layer 203, the third barrier layer 405, and the second adjustment layer 303. The following etch process may be an anisotropic dry etch process.

Figure 17:
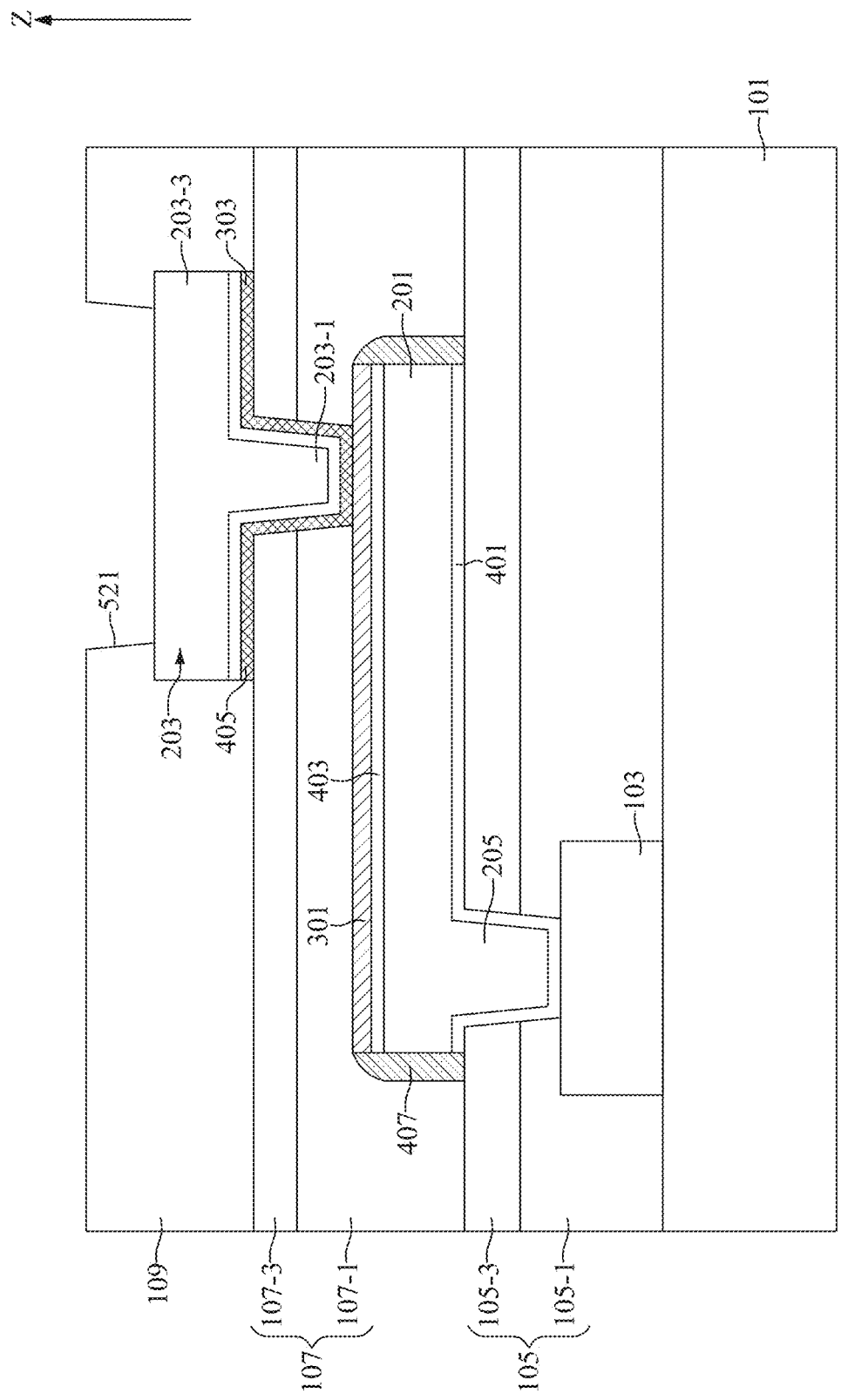
Figure 18:
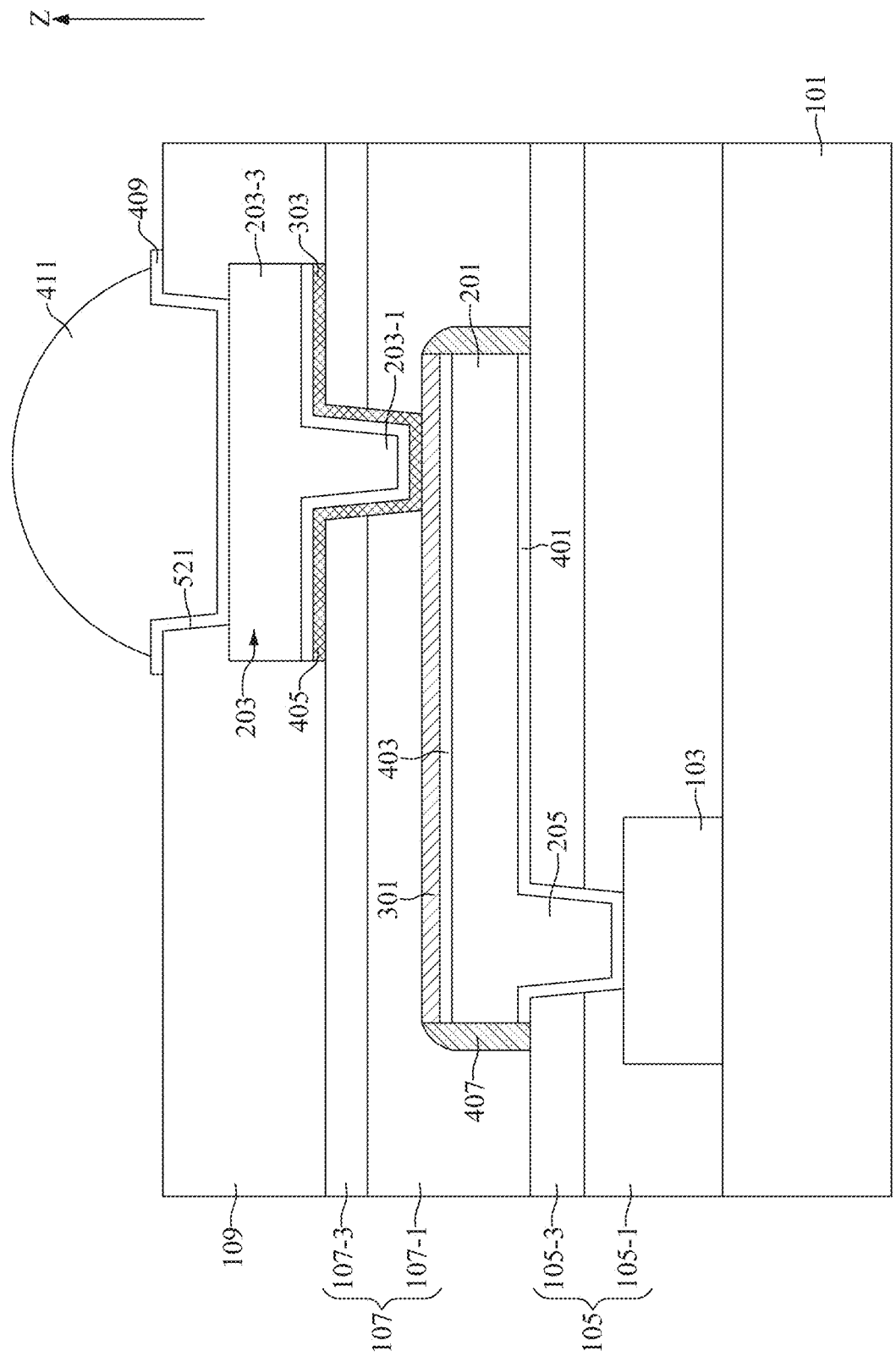

With reference to FIGS. 5, 17, and 18, at step S21, a bump unit 411 may be formed on the pad layer 203.

With reference to FIG. 17, the third passivation layer 109 may be formed to cover the pad layer 203, the third barrier layer 405, and the second adjustment layer 303. A planarization process, such as chemical mechanical polishing, may be performed to provide a substantially flat surface for subsequent processing steps. The third passivation layer 109 may be formed by chemical vapor deposition, plasma enhanced chemical vapor deposition, evaporation, or spin-on coating.

With reference to FIG. 17, the third opening 521 may be formed by a photolithography process and a following anisotropic etch process. A portion of the top surface of the pad layer 203 may be exposed through the third opening 521.

With reference to FIG. 18, a under bump metallization layer 409 may be conformally formed in the third opening 521. The under bump metallization layer 409 may be formed by, for example, physical vapor deposition, sputtering, electroplating, or other suitable deposition process. The bump unit 411 may be formed on the under bump metallization layer 409.

FIGS. 19 to 22 illustrate, in schematic cross-sectional view diagrams, a flow for fabricating the semiconductor device 1C in accordance with another embodiment of the present disclosure.

Figure 19:
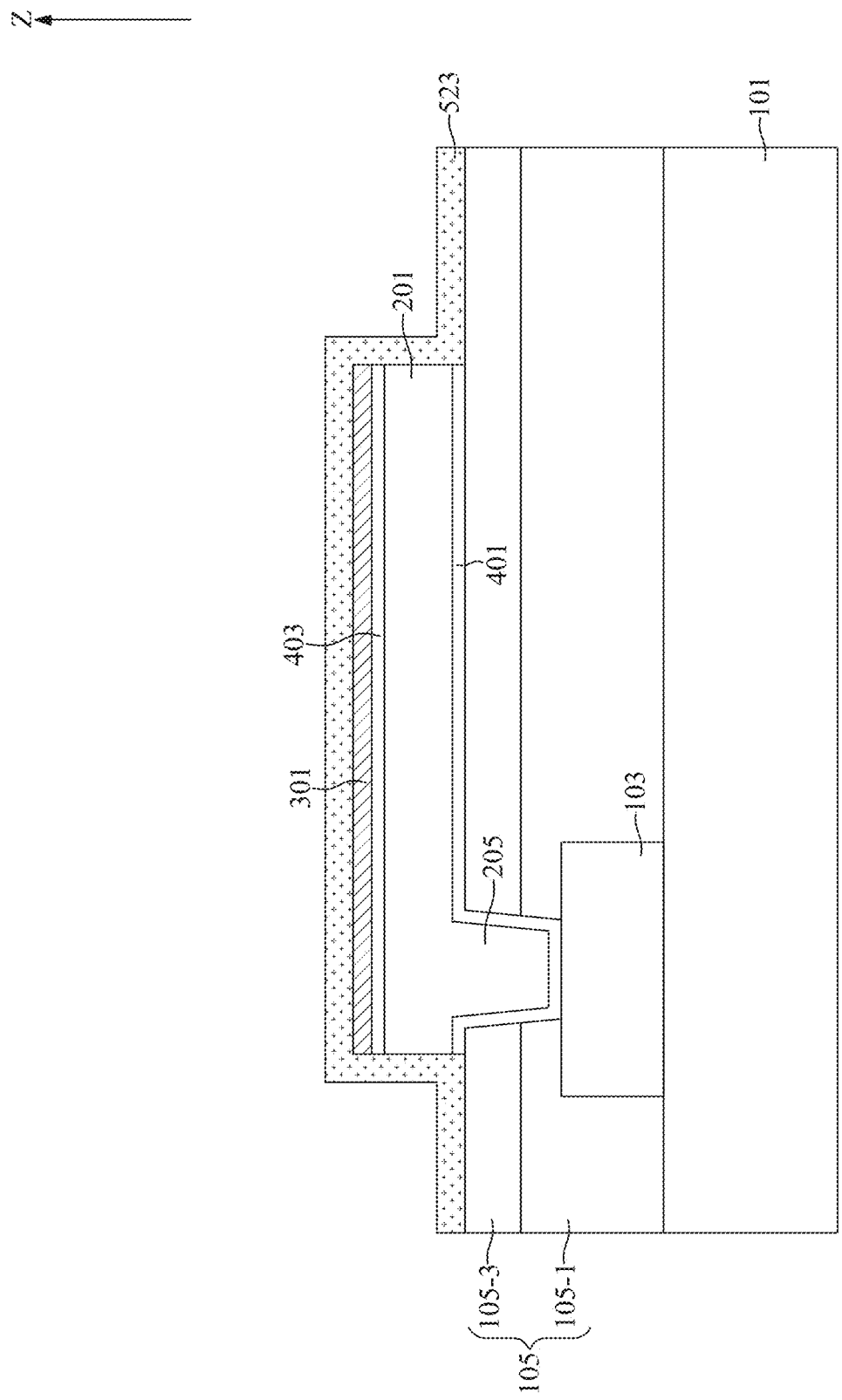
FIGS. 19 to 22 illustrate, in schematic cross-sectional view diagrams, a flow for fabricating the semiconductor device in accordance with another embodiment of the present disclosure.

With reference to FIG. 19, an intermediate semiconductor device may be fabricating with a procedure similar to that illustrated in FIGS. 6 to 9 may be provided. An energy-removable layer 523 may be conformally formed over the intermediate semiconductor device. The energy-removable layer 523 may include a material such as a thermal-decomposable material, a photonic-decomposable material, an e-beam decomposable material, or a combination thereof.

For example, the energy-removable layer 523 may include a base material and a decomposable porogen material that is sacrificially removed upon exposure to an energy source. The base material may include a methylsilsesquioxane based material, low-dielectric material, or silicon oxide. The decomposable porogen material may include a porogen organic compound that provides porosity to the base material of the energy-removable material.

Figure 20:
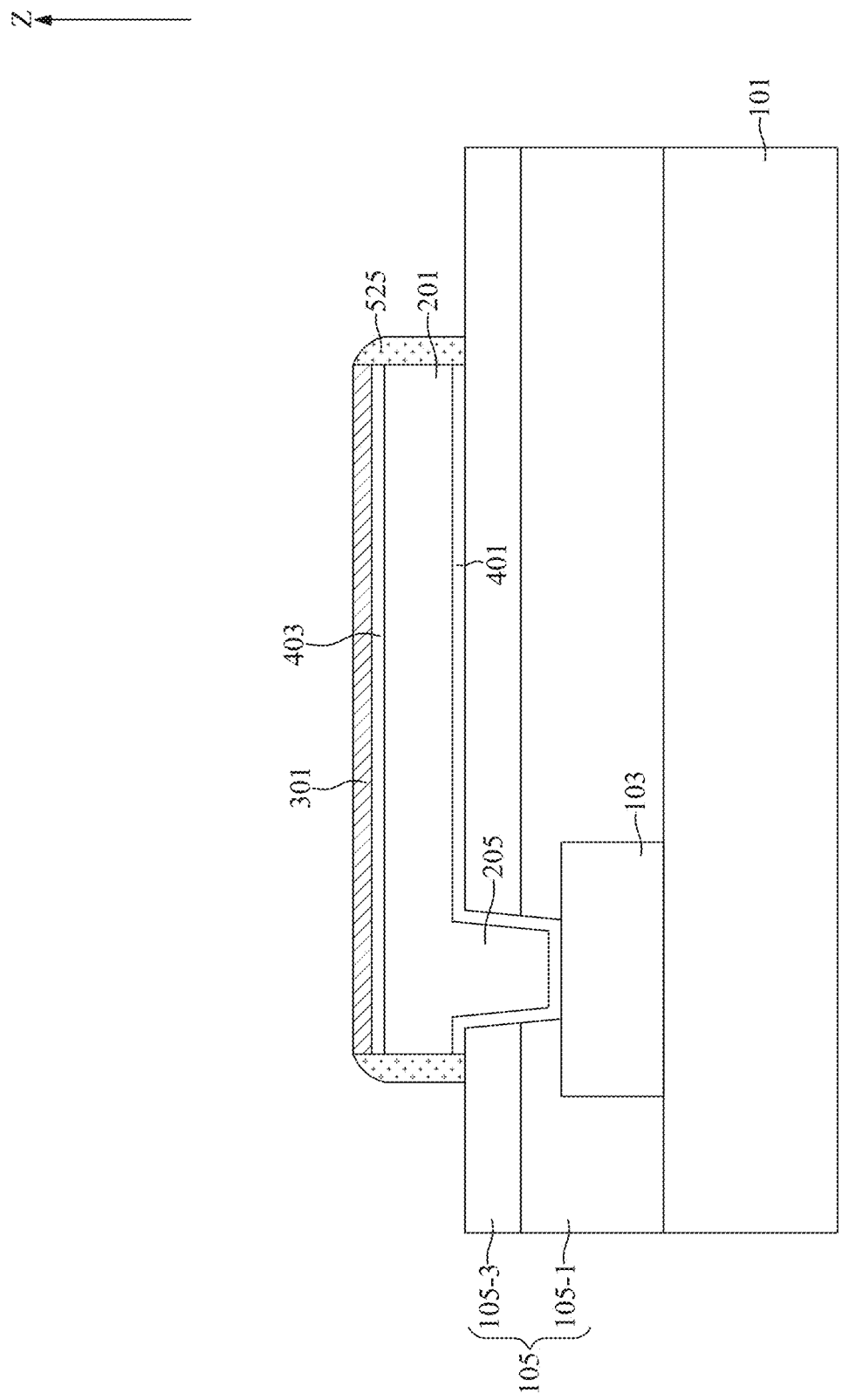

With reference to FIG. 20, an etch, for example, an anisotropic dry etch process, may be performed to remove portions of the energy-removable layer 523 and concurrently form sacrificial spacers 525.

Figure 21:
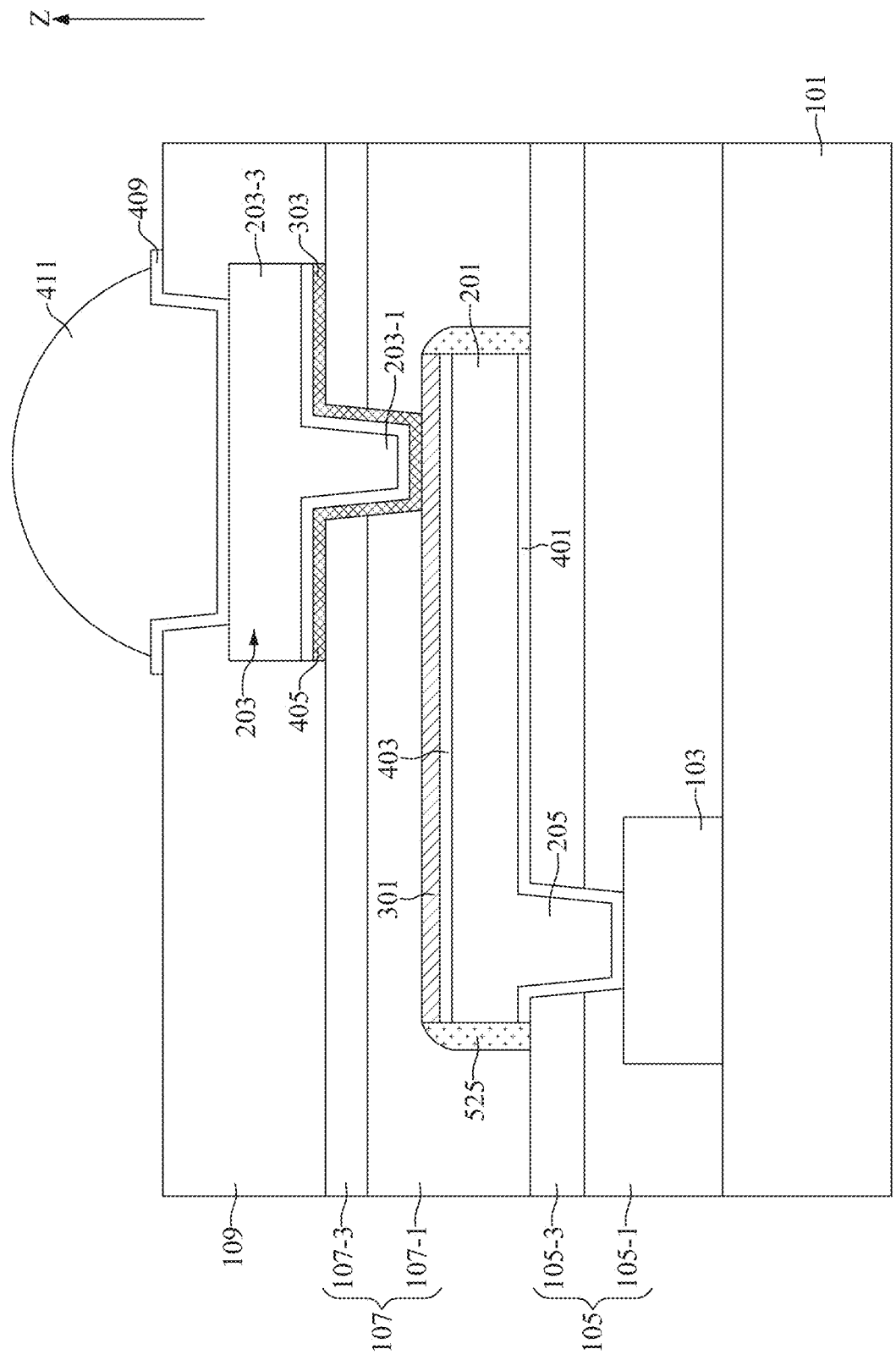

With reference to FIG. 21, elements may be formed with a procedure similar to that illustrated in FIGS. 12 to 18.

Figure 22:
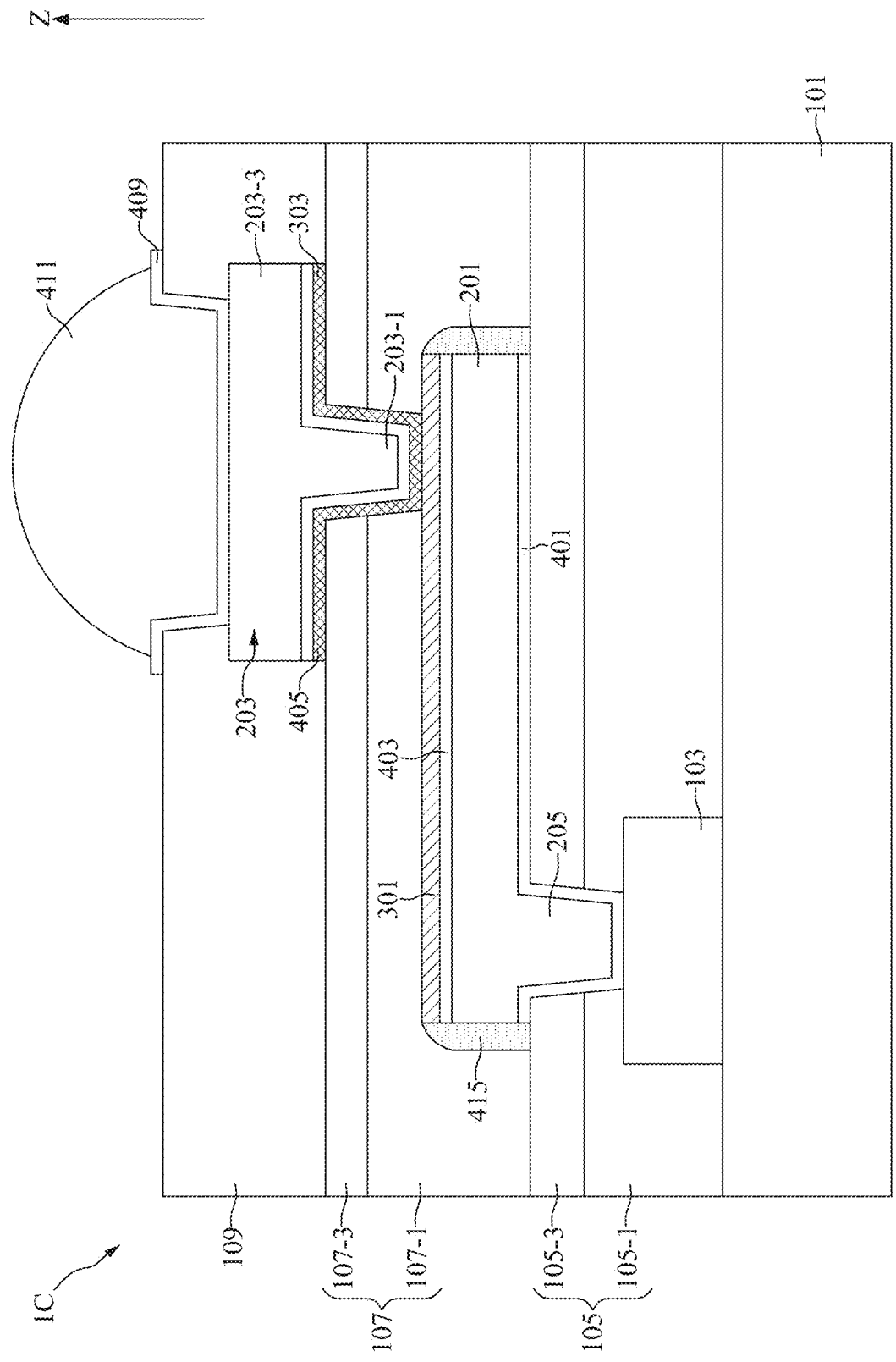

With reference to FIG. 22, an energy treatment process may be performed on the intermediate semiconductor device illustrated in FIG. 21 by applying an energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the sacrificial spacers 525 to generate empty spaces (pores), with the base material remaining in place. After the energy treatment, the sacrificial spacers 525 may be turned into porous spacers 415.

One aspect of the present disclosure provides a semiconductor device including a substrate, a first passivation layer positioned above the substrate, a redistribution layer positioned on the first passivation layer, a first adjustment layer positioned on the redistribution layer, a pad layer positioned on the first adjustment layer, and a second adjustment layer positioned between the pad layer and the first adjustment layer. The first adjustment layer and the second adjustment layer are formed of graphene.

Another aspect of the present disclosure provides a method for fabricating a semiconductor device including providing a substrate, forming a redistribution layer above the substrate, forming a first adjustment layer on the redistribution layer, forming a second adjustment layer on the first adjustment layer, and forming a pad layer on the second adjustment layer. The first adjustment layer and the second adjustment layer are formed of graphene.

Due to the design of the semiconductor device of the present disclosure, the first adjustment layer 301 and the second adjustment layer 303 may reduce the resistance between the pad layer 203 and the redistribution layer 201. Therefore, the power consumption of the semiconductor device 1A may be decreased. In other words, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a first passivation layer positioned above the substrate;
a redistribution layer positioned on the first passivation layer;
a first adjustment layer positioned on the redistribution layer;
a pad layer positioned on the first adjustment layer; and
a second adjustment layer positioned between the pad layer and the first adjustment layer;
wherein the first adjustment layer and the second adjustment layer are formed of graphene;
wherein the pad layer comprises a lower portion positioned on the first adjustment layer and an upper portion positioned on the lower portion;
wherein the second adjustment layer is positioned between the lower portion of the pad layer and the first adjustment layer, positioned on sidewalls of the lower portion of the pad layer, and positioned on bottom surfaces of the upper portion of the pad layer.

2. The semiconductor device of claim 1, further comprising a second passivation layer positioned on the first passivation layer, wherein the redistribution layer and the lower portion of the pad layer are positioned in the second passivation layer, and the upper portion of the pad layer is positioned on the second passivation layer.

3. The semiconductor device of claim 2, wherein the second passivation layer comprises a lower layer positioned on the first passivation layer and an upper layer positioned on the lower layer, the redistribution layer is positioned in the lower layer of the second passivation layer, and the lower portion of the pad layer is positioned along the upper layer of the second passivation layer and extending to the lower layer of the second passivation layer.

4. The semiconductor device of claim 3, wherein the lower layer of the second passivation layer is formed of silicon oxide or phosphosilicate glass and the upper layer of the second passivation layer is formed of silicon nitride, silicon oxynitride, or silicon oxide nitride.

5. The semiconductor device of claim 4, further comprising a first barrier layer positioned between the redistribution layer and the first passivation layer.

6. The semiconductor device of claim 5, further comprising a second barrier layer positioned between the redistribution layer and the first adjustment layer.

7. The semiconductor device of claim 6, further comprising a third barrier layer positioned between the pad layer and the second adjustment layer.

8. The semiconductor device of claim 7, wherein the first barrier layer is formed of titanium, titanium nitride, titanium silicon nitride, tantalum, tantalum nitride, tantalum silicon nitride, or a combination thereof.

9. The semiconductor device of claim 8, further comprising a topmost conductive line positioned in the first passivation layer and a conductive via electrically connecting the redistribution layer and the topmost conductive line.

10. The semiconductor device of claim 9, wherein the first passivation layer comprises a bottom layer positioned above the substrate and a top layer positioned on the bottom layer, the topmost conductive line is positioned in the bottom layer of the first passivation layer, and the conductive via is positioned along the top layer of the first passivation layer and extending to the bottom layer of the first passivation layer.

11. The semiconductor device of claim 10, further comprising first spacers positioned on sidewalls of the first adjustment layer and sidewalls of the redistribution layer.

12. The semiconductor device of claim 11, further comprising a bump unit positioned on the pad layer.

13. The semiconductor device of claim 12, further comprising an under bump metallization layer positioned between the bump unit and the pad layer.

14. The semiconductor device of claim 10, further comprising porous spacers positioned on sidewalls of the first adjustment layer and sidewalls of the redistribution layer.

15. The semiconductor device of claim 14, wherein a porosity of the porous spacers is between about 50% and about 100%.

16. A method for fabricating a semiconductor device, comprising:
providing a substrate;
forming a redistribution layer above the substrate;
forming a first adjustment layer on the redistribution layer;
forming a second adjustment layer on the first adjustment layer; and
forming a pad layer on the second adjustment layer;
wherein the first adjustment layer and the second adjustment layer are formed of graphene;
wherein the pad layer comprises a lower portion positioned on the first adjustment layer and an upper portion positioned on the lower portion;
wherein the second adjustment layer is positioned between the lower portion of the pad layer and the first adjustment layer, positioned on sidewalls of the lower portion of the pad layer, and positioned on bottom surfaces of the upper portion of the pad layer.

17. The method for fabricating the semiconductor device of claim 16, further comprising a step of forming first spacers on sidewalls of the first adjustment layer and on sidewalls of the redistribution layer.

18. The method for fabricating the semiconductor device of claim 17, further comprising a step of forming a first barrier layer above the substrate, wherein the redistribution layer is formed on the first barrier layer.

* * * * *